(12) United States Patent
Vazquez Carazo

(10) Patent No.: US 7,019,993 B2
(45) Date of Patent: Mar. 28, 2006

(54) PIEZOELECTRIC TRANSFORMER AND MODULAR CONNECTIONS FOR HIGH POWER AND HIGH VOLTAGE POWER SUPPLIES

(75) Inventor: Alfredo Vazquez Carazo, Norfolk, VA (US)

(73) Assignee: Face International Corp., Norfolk, VA (US)

( * ) Notice: Subject to any disclaimer, the term of this patent is extended or adjusted under 35 U.S.C. 154(b) by 57 days.

(21) Appl. No.: 10/844,160

(22) Filed: May 12, 2004

(65) Prior Publication Data

US 2005/0030774 A1 Feb. 10, 2005

Related U.S. Application Data

(60) Provisional application No. 60/469,646, filed on May 12, 2003.

(51) Int. Cl.
*H02M 3/24* (2006.01)
*H01L 41/07* (2006.01)

(52) U.S. Cl. ............................ 363/67; 363/84; 310/359

(58) Field of Classification Search .................. 363/15, 363/65, 67, 84; 310/316.01, 318, 359, 366
See application file for complete search history.

(56) References Cited

U.S. PATENT DOCUMENTS

| | | | | |
|---|---|---|---|---|
| 5,751,092 | A | * | 5/1998 | Abe ............................ 310/359 |
| 6,052,300 | A | * | 4/2000 | Bishop et al. ............... 363/131 |
| 6,229,247 | B1 | * | 5/2001 | Bishop ........................ 310/328 |
| 6,246,153 | B1 | * | 6/2001 | Bishop et al. ............... 310/318 |
| 6,326,718 | B1 | * | 12/2001 | Boyd ........................... 310/359 |
| 6,333,589 | B1 | * | 12/2001 | Inoi et al. .................... 310/358 |
| 6,362,559 | B1 | * | 3/2002 | Boyd ........................... 310/359 |
| 2004/0201328 | A1 | * | 10/2004 | Vazquez Carazo .......... 310/359 |

* cited by examiner

*Primary Examiner*—Adolf Berhane
(74) *Attorney, Agent, or Firm*—David J. Bolduc

(57) ABSTRACT

A modular design for combining piezoelectric transformers is provided for high voltage and high power conversion applications. The input portions of individual piezoelectric transformers are driven for a single power supply. This created the vibration and the conversion of electrical to electrical energy from the input to the output of the transformers. The output portions of the single piezoelectric transformers are combining in series and/or parallel to provide multiple outputs having different rating of voltage and current.

1 Claim, 14 Drawing Sheets

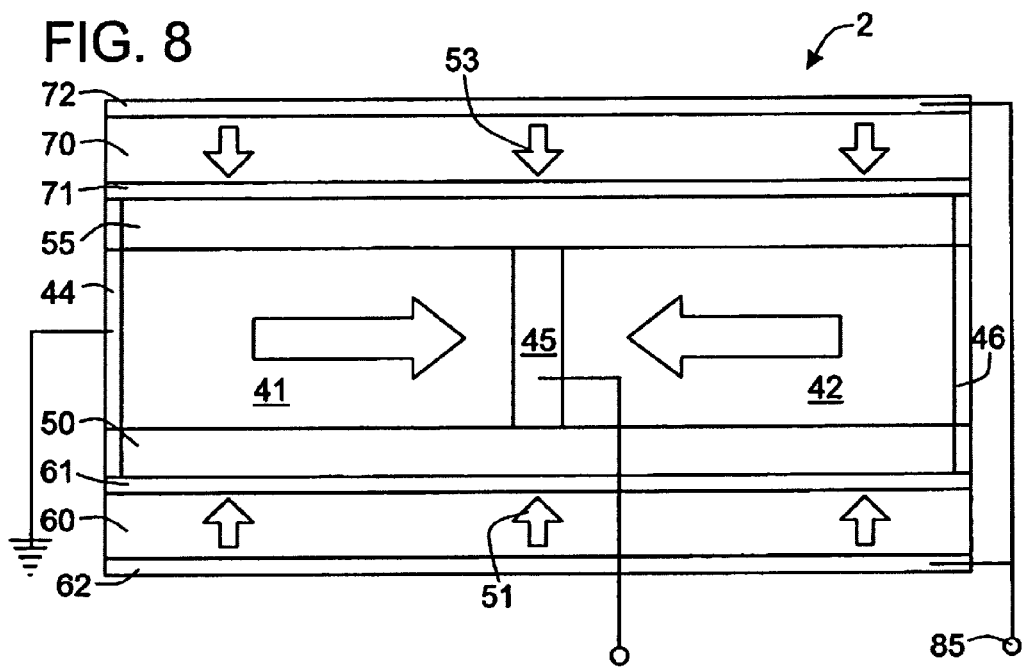
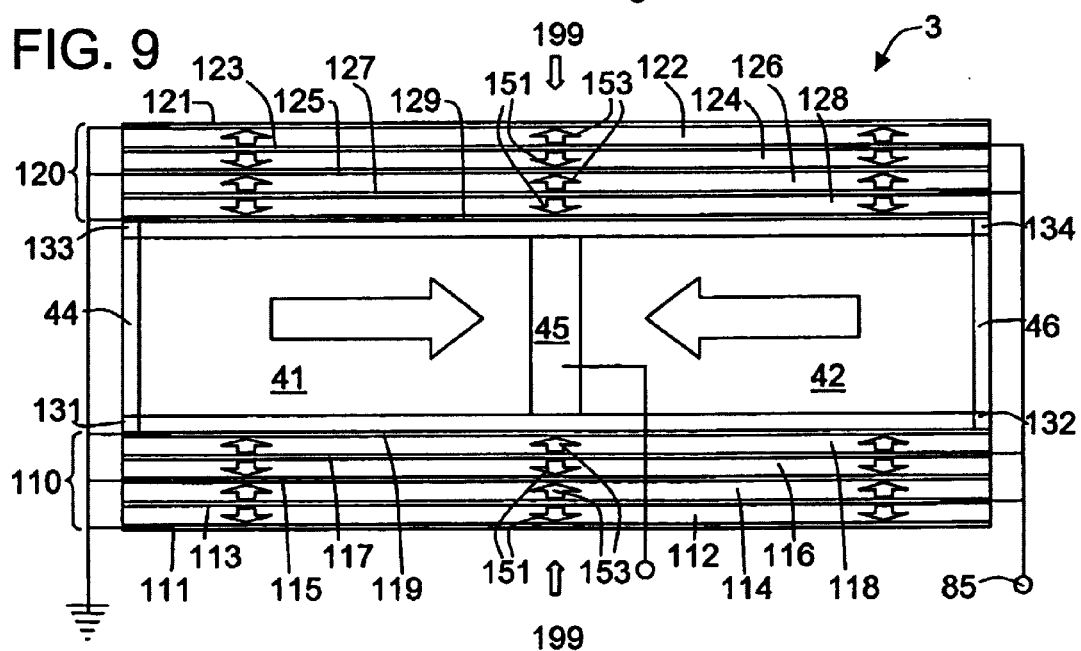

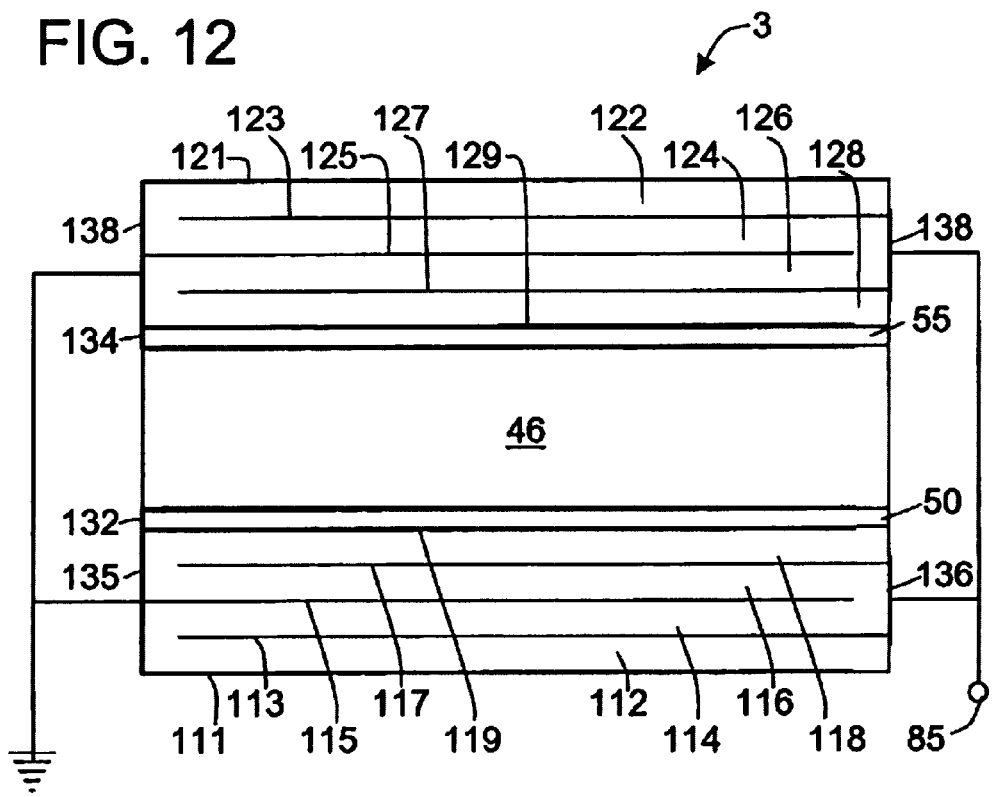
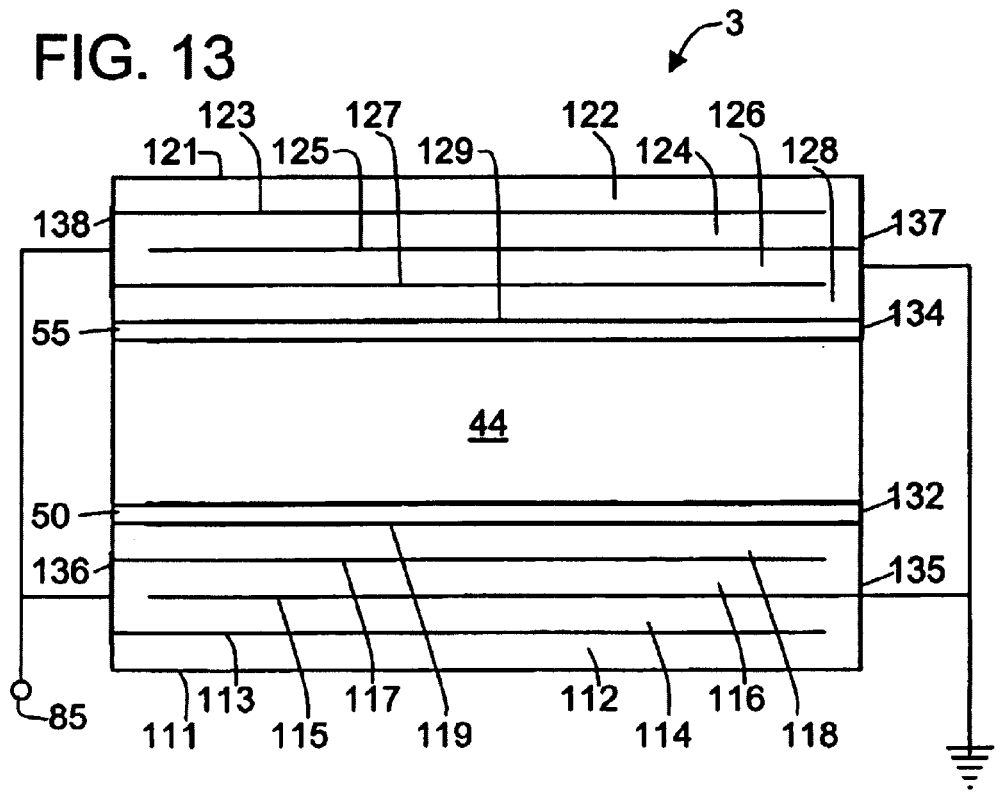

PIEZOELECTRIC TRANSFORMER AND MODULAR CONNECTIONS FOR HIGH POWER AND HIGH VOLTAGE POWER SUPPLIES

This invention claims priority from U.S. Provisional application No. 60/469,646 filed May 12, 2003.

This invention was made with government support under SBIR contracts Case Number NAS3-02023 SBIR 2001-I and Case Number NAS3-02168 SBIR 2001-II awarded by the National Aeronautics and Space Administration (NASA). The U.S. Government has certain rights in the invention.

BACKGROUND OF INVENTION

1. Field of Invention

The present invention relates generally to piezoelectric ceramic transformers for power transfer circuits. More specifically, the present invention relates to the combination of piezoelectric transformers in a modular way to be use in a power supply system that delivers a plurality of selectable outputs at high voltage and high power. Different circuit topologies using piezoelectric transformers are provided that supply different voltages and powers rating to one or different loads requiring multiple voltages and power levels.

2. Description of the Prior Art

A common requirement to all phases of electronics that is the need for a supply of regulated DC power. Power supplies have been used in the state of the art to provide voltage and power to electric loads. Most power supplies are designed to meet some or all of the following requirements: (a) regulated output, (b) isolation, and (c) multiple outputs. A regulated output is required to maintain the output voltage within a specified tolerance for changes within a specified range in the input voltage and the output loading. Isolation is required to separate electrically the output from the input. Multiple outputs that may differ in their voltage and current ratings (power) and are isolated from each other are required to supply different voltages to different loads, or to the same load requiring multiple voltages.

In addition to these requirements, common goals on power supplies design are to reduce power supply size and weight and improve their efficiency. Furthermore, reduction of the electromagnetic interference (EMI) signature is a goal in systems where the integration of the power supply with other electronic components is required.

Traditionally, linear power supplies have been used. However, advances in the semiconductor technology have lead to switching power supplies, which are smaller and much more efficient compared to linear power supplies.

Referring to FIG. 1: A typical example of a linear power supply is shown in FIG. 1. Linear power supplies suffer of two major drawbacks. First, a low-frequency (50 Hz or 60 Hz) transformer is required to provide isolation between the input and the output and to deliver the output in the desired voltage range. Such transformers are larger in size and weight compared to high-frequency transformers. This represents a big penalty in the final size and weight of the power supply. Second, a linear transistor is connected in series that operate in its active region to regulate the output DC voltage. The linear transistor acts as an adjustable resistor where the voltage difference between the input and the desired output voltage appears across the transistor and causes power losses in it. Since the transistor operates in its active region, a significant amount of power is lost in it. Therefore, the overall efficiencies of linear power supplies are usually in a range of 30–60%.

Referring to FIG. 2: As opposed to linear power supplies, in switching power supplies, the transformation of DC voltage from one level to another is accomplished by using DC-to-DC converter circuits (or those derived from them). These circuits employ solid-state devices (transistors, MOSFETs, etc.), which operate as a switch: either completely off or completely on. Since the power devices are not required to operate in their active region, this mode of operation results in lower power dissipation. Increased switching speeds, higher voltage and current ratings, and a relatively lower cost of these devices are the factors that have contributed to the emergence of switching power supplies. Typical schematic of a switch-mode DC power supply is illustrated in FIG. 2.

Two major advantages of switching power supplies over linear power supplies are: (a) The switching elements (power transistors or MOSFETs) operate as a switch: either completely off or completely on. By avoiding their operation in their active region, a significant reduction in power losses is achieved. This results in higher energy efficiency in a 70–90% range. Moreover, a transistor operating in on/off mode has a much larger power-handling capability compared to its linear mode, so the size is reduced. (b) Since a high-frequency isolation transformer is used (as compared to a 50- or 60 Hz transformer in a linear power supply), the size and weight of switching supplies can be significantly reduced.

On the negative side, switching power supplies suffer of the drawback of using magnetic transformers at very high frequencies. This results in much higher EMI signature compare to linear power supplies. The magnetic transformer is still the largest component of the power supplies. This component limited the maximum power density and size of the power supplies.

Classically, wire wound-type electromagnetic transformers have been used for generating a transformation from one input voltage level to a different voltage level. Step-up and step-down applications can be found in the prior state of the art. For instance, wire wound-type electromagnetic transformers have been used for step-up applications for generating high voltage in internal power circuits of devices such as televisions, fluorescent lamp ballasts, CCFL backlighting, and others. Also, electromagnetic transformers have been using in step-down applications such as battery chargers for lap-top computers, cell phones, and other similar applications.

Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. In addition to being large in size and weight, wound transformers create EMI which can disrupt the performance of other circuits and components in proximity to the transformer, which is a major issue in compact portable devices having a multitude of circuitry in a small packing area, such as laptop computers, PDA's, camcorders, and other handheld devices. Furthermore, in view of high frequency applications and compact size application, the electromagnetic transformer has many disadvantages related to the materials used in their manufacturing. Magnetic materials used for the cores of transformers have two types of electrical losses, eddy current loss due to finite electrical conductivity and hysteresis (magnetic) loss. A third type of loss is related to the windings of the transformer. These windings are made from copper wire, which copper losses include not only DC resistance loss, and additional ohmic loss caused by non-uniform current density concentrations arising from the proximity effect and skin effect. These losses, specifically hysteresis and skin effect losses increase in high frequency applications and force the designing engineer to over-design the magnetic components which, in turn, affects the final size. Furthermore, wire-wound transformers also require winding isolation material, which also affects the final size of the component. This is even a bigger issue in high voltage transformers where dielectric breakdown risk between high voltage and low voltage wiring limits the minimum thickness of the isolation material used. Furthermore, the maximum permissible temperature of a transformer is approximately 100° C. and is limited by both magnetic material and winding isolation material considerations. This temperature limit along with the surface-to-ambient thermal resistance of the component limit the average power dissipation density (W/cm$^3$) in the component. This power dissipation density limit translates into a maximum current density limit in the copper winding and a maximum peak AC flux density in the core material, and thus in the maximum power density that the wire-wound transformer can supply.

To remedy this and many other problems of wire-wound transformers, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and dimensions and shape of materials of construction of the transformer including the piezoelectric ceramics and electrodes. Furthermore, PTs have a number of advantages over general electromagnetic transformers. The size of PTs can be made much smaller than electromagnetic transformers of comparable transformation ratio, PTs are nonflammable, and produce no electromagnetically induced noise.

Piezoelectric transformer technology has evolved around three fundamentally different PT families: "Rosen-type" PTs, "Thickness-type" PTs, and "Laminated-type" PTs. Rosen-type PTs were the first PTs developed and are characterized by a common area for the input and the output section corresponding to the transversal area of the ceramic body. This area is typically transverse to the propagation direction of the acoustic standing front-wave. Furthermore, the input to output coupling area is also, typically, the nodal area of the PT, i.e., the area with no deformation and higher stress levels. Rosen-PTs have been proposed in rectangular, circular, or annular shapes. Thickness-type PTs make use of discs or plates vibrating in the thickness mode. In these PTs, the coupling areas between the input and the output are the major surfaces of the input and output sections. In these PTs, the nodal point is established in the coupling area. In laminated-type PTs the input and output are also acoustically coupled at their major surfaces. However, in these types of PTs the nodal point does not separate the input from the output section. The coupling area between input and output is NOT a nodal area of the PT, but it moves with the vibration of the PT.

The basic Rosen-type piezoelectric transformer was disclosed in U.S. Pat. No. 2,830,274 and numerous variations of this basic apparatus are well known in the prior art. The typical Rosen-type PT comprises a flat ceramic slab 20 appreciably longer than it is wide and substantially wider than it is thick. Rosen-type PTs have been proposed in various forms and configurations, including rings, flat slabs and the like as disclosed in U.S. Pat. No. 2,830,274 (1958) by C. Rosen el al., U.S. Pat. Nos. 3,562,792 (1971) and 3,764,848 (1973) both by D. Berlincourt, U.S. Pat. No. 4,767,967 (1988) by Tanaka et al, U.S. Pat. No. 5,736,807 by Hakamata et al., and others. Typical examples of a prior Rosen-type PTs are illustrated in FIGS. 3 and 4. In the case of FIG. 3, the piezoelectric body 20 is in the form of a flat slab that is considerably wider than it is thick, and having greater length than width.

As shown in FIG. 3, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the face of the slab (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 3, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode (d31 mode). The transverse effect mode vibration in the low impedance vibrator portion 21 in turn excites a vibration in the high impedance generator portion 22 in a longitudinal effect longitudinal vibration mode (g33 mode). As the result, high voltage output is obtained between electrode 28 and 35. Typically, Rosen-type PTs are designed to operate under half wavelength (lambda/2) or three half wavelength (3×lambda/2). The total length of the PT of FIG. 3 determines the value of the operational resonance frequency of the PT.

An inherent problem of such prior Rosen-PTs is that they have relatively low power transmission capacity. This disadvantage of prior PTs relates to the fact that little or no mechanical advantage is realized between the vibrator portion 21 of the device and the driver portion 22 of the device. Because the driver and vibrator portions each is intrinsically a part of the same electroactive member, the transmission of energy between portions is limited to the transverse area of the longitudinal body. This inherently restricts the mechanical energy transmission capability of the device, which, in turn, inherently restricts the electrical power handling capacity of such devices.

A second problem of Rosen-PTs, such the one of FIG. 3, is the non-symmetric structure in the length direction. Since the polarization direction in ceramic piezoelectric materials relies significantly on the material properties, such as in the stiffness, dielectric permitivity, and piezoelectric properties, the mechanical behavior of the Rosen-PT will not be mechanically symmetrical in the length direction. As a result, Rosen-PTs show spurious bending resonances around the main resonance frequency, specifically when thin bodies are used. This bending resonance may interfere with the main resonance of the PT and thus diminish the efficiency of the PTs. Additionally, the spurious bending resonance may affect the tracking circuitry of the Rosen-PT and may render the PT useless in practice.

Additionally, since the transmitted power density is limited by the strain endurance of the piezoelectric material, Rosen-type PTs are limited in power to the maximum permissible tensile stresses in the nodal transversal area, which is typically very small. As consequence of this, Rosen-PTs become mechanically weak and may suffer fracture in the nodal transversal area.

Another problem with prior Rosen PTs is that the input and output capacitances depend upon the total dimension of the ceramic bar used. Once the dimensions of the slab are selected, the value of the output capacitance design is fixed since it depends on the thickness of the bar and the half of the total length of the bar for Rosen-type PT operating in the lambda-half mode.

Another drawback of conventional Rosen-type PTs is that since the electrode of the high voltage section is located in the loop of vibration, i.e., in the vibrating direction, connection of the external terminals adversely affects vibration or largely degrades reliability.

Referring to FIG. 5: The second family of PTs is the "Thickness-type PT", which are PTs polarized and vibrating in the thickness direction (i.e., vibrations are parallel to the direction of polarization of the layers). Illustrative of such thickness mode vibration PTs is the device of U.S. Pat. No. 5,118,982 to Inoue shown in FIG. 5. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT of FIG. 5 comprises a low impedance vibrator portion 11 including a plurality of piezoelectric layers 211 through 214 and a high impedance vibrator portion 12 including a piezoelectric layer 222, each of the layers being integrally laminated, and caused to vibrate in thickness-extensional mode. The low impedance portion 11 has a laminated structure which comprises multi-layered piezoelectric layers 211 through 214 each being interposed between electrodes including the top surface electrode layer 201 and internal electrode layers 231 through 234. The high impedance portion 12 is constructed of the bottom electrode layer 202, an internal electrode layer 234 and a single piezoelectric layer 122 interposed between both electrode layers 202 and 234. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness. The PT has a common electrode 234 to which one terminal 16 of each portion is connected. The total thickness of the PT of FIG. 5 is restricted to a half wavelength (lambda/2) or one full wavelength (lambda) of the drive frequency.

When an alternating voltage is applied to the electrode layers across the ceramic layer of the vibrator portion 11, a vibration is excited in the ceramic parallel to the direction of the polarization of the layers in the longitudinal vibration mode (d33 mode). This vibration of the low impedance portion 11 excites a vibration (g33 mode) in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode with a resonance of lambda/2 mode (both end free fundamental mode) or lambda mode (both end-free secondary mode), the PT may operate in a frequency range of 1–10 MHz.

An inherent problem with prior thickness mode PTs is that the thickness mode resonant frequency is too high for some applications. Although the high frequency operation initially promotes higher power efficiency, the power loss generated by circulating current in the PT decreases significantly the PT efficiency and consequently increases the heat generation, limiting the maximum power available.

Another problem with prior thickness mode PTs is the losses affecting the driving switching inverter used to drive them, which limit the application of these PTs to high power applications.

Another problem with prior thickness mode PTs is their limitation to reach high output voltages, due to their thin thickness and low output impedance, which leaves them out of the scope of the present invention.

Referring now to FIGS. 6 and 7: The third family of PTs is the "Laminate-type PTs". Two types of laminated-type PTs include radial-type laminated piezoelectric transformers and longitudinal-type piezoelectric transformers. In general, a laminated PT typically comprises a high impedance portion 60 and a low impedance portion 40 stacked on each other. The vibrator portion 21 is polarized transversely to the plane of the face of the slab (in the thickness direction) and has a high impedance in the direction of polarization. The high impedance portion 60 is polarized in the thickness direction. The low impedance portion 40 is divided in two parts by a belt electrode printed in the center of the slab. Each portion 41 and 42 is polarized in the longitudinal direction. Laminated PTs have been demonstrated to overcome the power limitations of Rosen type PTs and thickness-type PTs. Radial laminated PTs are used for step-down applications, such as battery chargers for laptops and cell phones, as well as in ballast for fluorescents. Longitudinal laminated PTs are preferred in step-up transformers.

In step-down laminated-type PTs, such as in FIG. 6, the input portion (driver section) has higher impedance (lower capacitance) than the output portion (generator section). Thus, the output voltage of the transformer has a lower value that the input voltage applied to the driver section. Step-down laminated-type PTs are typically made using radial type PTs. Illustrative of such step-down laminated PTs is the device disclosed in U.S. Pat. No. 5,834,882 to Richard P. Bishop (1998), U.S. Pat. No. 6,333,589 (2001) to Inoi, and U.S. Application Patent 20030067252 by Alfredo Vazquez Carazo, shown in FIG. 6

In step-up laminated-type PTs, such as in FIG. 7, the input portion (driver section) has a lower impedance (higher capacitance) than the output portion (lower capacitance). Thus, the output voltage of the PT has a higher value that the input voltage applied to the driver section. Step-up laminated-type PTs are typically made using longitudinal type PTs. Illustrative of such step-up laminated PTs is the device disclosed in U.S. Pat. No. 6,326,718 (2001) by Boyd et al. (The Face Companies), shown in FIG. 7.

A global problem of the prior state of the art of the piezoelectric transformer technology is the impossibility of providing multiple outputs that may differ in their voltage and current rating. In this prior state of the art, the piezoelectric transformer has a limitation of providing a single output voltage to drive a specific load.

Thus, an inherent problem of the prior state of the art of power supplies using piezoelectric transformer technology is the limitation to achieve very high voltages beyond the manufacturing possibilities of a simple sample of PT.

Another problem of the prior state of the art of power supplies using piezoelectric transformer technology is the limitation to achieve very high power levels beyond the manufacturing possibilities of a simple sample of PT.

Another problem of the prior state of the art of power supplies using piezoelectric transformer technology is the impossibility to provide at the same time high power and high voltage levels at the same time to the load.

Another limitation of the prior state of the art of power supplies using piezoelectric transformer technology is the impossibility of providing multiple outputs to drive different loads.

Another limitation of the prior state of the art of power supplies using piezoelectric transformer technology is the impossibility of providing multiple outputs which differ in their voltage and current rating.

Another limitation of the prior state of the art of power supplies using piezoelectric transformers technology is the impossibility of providing multiple outputs which are isolated from the input.

Accordingly, it would be desirable to provide designs for combining piezoelectric transformers that has a higher step-up ratio capacity beyond the capacity of single units of piezoelectric transformers.

It would also be desirable to provide designs for combining piezoelectric transformers that can provide at the same time high levels of voltage and high level of power beyond the capacity of single units of piezoelectric transformers It would also be desirable to provide designs for combining piezoelectric transformers that has a higher power transmission capacity than similarly sized prior power supplies.

It would also be desirable to provide designs for combining piezoelectric transformers that capable of providing a plurality of outputs which may differ in their voltage and current ratings and may be isolated from each other and from the input.

It would also be desirable to provide designs for combining piezoelectric transformers has a lower signature of EMI compared to prior state of the art power supplies.

It would also be desirable to provide a circuit of the character described that is highly compact and efficient.

SUMMARY OF THE INVENTION

According to the present invention, there is provided a modular design for combining piezoelectric transformers. Each piezoelectric transformer (PT) is preferably operating at its natural (i.e. "resonant") frequency to convert a transformer input signal of a first character (i.e. voltage, frequency and current) to a transformer output signal of a second character (i.e. voltage, frequency and current). The disclosed modular design accomplishes the objective of providing very high power and very large voltage at the same time that providing multiple outputs having different voltage and current ratings.

The disclosed modular design efficiently accomplishes the conversion of electrical to mechanical to electrical energy by subjecting the input "driver" sections of different PTs to an alternating voltage (or in certain embodiments a pulsed voltage) which causes the input portion(s) to deform and vibrate, which in turn causes the output portion(s) to vibrate, which in turn causes the "driven" output portion of the PT to deform, and which in turn generates an output voltage at the driven section of the transformer. The output of the multiple PTs of this modular design are conveniently connected in series and/or parallel to increase the level of the output voltage or/and power.

The preferred embodiment of the invention provides a modular design for combining piezoelectric transformers having a single input which is used to drive the PTs and multiple output taps. Many combinations of output voltages are available by selection of a voltage between a ground terminal and high voltage terminal of one or more of the PTs.

The preferred embodiment of the invention uses laminated piezoelectric transformer PTs of the longitudinal type but the same description is valid for radial type laminated PTs, Rosen or Thickness mode PTs described above and in FIGS. 3–7. The preferred laminated longitudinal PT is shown in FIGS. 8–12, and described in greater detail herein below. The preferred laminated longitudinal PT has first and second bar-shaped input piezoelectric portions, each of which is bonded on one of its major faces to first and second insulation layers. The input portions each comprise multiple thin layers with internal electrodes as well as external electrodes on both major faces. The electrodes are connected alternatively by means of two external electrodes in the length edge of the bar. The input portions are poled between the electrodes perpendicular to the input layer's major faces (in the thickness direction). This polarization process creates internal polarization in the internal multiple thin layers being the direction of polarization opposite to the following layer. As a result, the internal layers are connected in parallel. Application of an alternating voltage causes the input portions to expand and contract in the transverse direction to the poling direction depending on the polarity of the voltage.

The output portion of the PT comprises another bar-shaped layer of PZT bonded along both major faces to the other side of the insulator layers. The output portion comprises multiple thin layers, each of which has a central printed electrode having a width significantly smaller than the total length of the output bar. The multiple layers are sintered together and two opposing electrodes are printed on two opposing minor faces. A central ring electrode is made by connecting the multiple internal electrodes in the central area of the PT output portion. The multiple internal electrodes are screen printed. The output portion is poled in the direction perpendicular to the minor faces of the output portion, preferably towards the central electrode. A longitudinal deformation of the input portions causes a deformation of the output portion in the thickness direction, which generates the output voltage across the output electrodes. A more detailed description of the construction of the input and output portions in an earlier embodiment of a similar transformer is disclosed in co-owned U.S. Pat. No. 6,326,718 to Boyd, and U.S. patent application Ser. No. 10/410,371 of Vazquez Carazo, dated Apr. 9, 2003, which are hereby incorporated by reference.

Accordingly, it is an object the present invention to provide a modular design for combining piezoelectric transformers that vibrates with a high frequency and may achieve a higher gain than prior existing PTs.

It is another object of the present invention to provide a modular design for combining piezoelectric transformers that has a higher power transmission capacity than prior existing PTs.

It is another object of the present invention to provide a modular design for combining piezoelectric transformers that can provide multiple outputs from a single input.

It is another object of the present invention to provide a modular design for combining piezoelectric transformers that can provide isolation between the input and the output portions.

It is another object of the present invention to provide a modular design for combining piezoelectric transformers of the character described that has a smaller size and a lower profile than prior PTs that have similar power transmission capacities.

It is another object of the present invention to provide a modular design for combining piezoelectric transformers that generate significantly less EMI signature than similar rated magnetic transformers.

It is another object of the present invention to provide a power supply circuit using multiple PTs placed in parallel or/and in series operation.

It is another object of the present invention to provide a power supply circuit using single voltage input to drive multiple PTs.

It is another object of the present invention to provide a power supply circuit having multiple combinations of output voltages available by selection of a voltage between a ground terminal and high voltage terminal of one or more of the PTs.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which:

FIG. 8 is a partial schematic elevation view of the an embodiment of the laminated piezoelectric transformer showing the details of construction of an output portion bonded between two input portions, as well as preferred input and ground connections;

FIG. 9 is a partial schematic elevation view of the preferred embodiment of a piezoelectric transformer using two multilayer input portions and showing the preferred input and ground connections;

FIG. 12 is a partial schematic elevation view of the PT of FIG. 9 showing the interdigitation of the input electrodes and common ground connection through belt electrodes;

FIG. 13 is a partial schematic elevation view of the PT of FIG. 12 as viewed from the opposite side showing the interdigitation of the input electrodes and common ground connection through belt electrodes;

DESCRIPTION OF THE PREFERRED EMBODIMENT

Circuit Topologies for Combining Piezoelectric Transformers

In the present invention, different topologies for combining single piezoelectric transformers are provided for high power conversion and/or high voltage generation as well as for providing multiple outputs which may be isolated from the input. Typical PTs described in the prior art are limited in the maximum power and output voltage that can produce. So far, the application of PTs has been for step-up applications with low power requirements, of for step-down applications with high power requirements. However, applications requiring high power and high voltage has not been addressed in the past with piezoelectric transformers.

Typical high voltage PTs have been proposed in the past using Rosen-type PTs. In this type of PT the high voltage transformation and the power transfer is obtained by designing the input and output capacitances in a certain way. Since the transformation ratio is approximately proportional to the input to output capacitance ratio, attempts have been made to increase the input capacitance by using multilayer technology in the input portion of the PT. However, the output capacitance remains fixed for a given ceramic dimensions, since for the typical operation of the lambda-half Rosen-PT, the output section is approximately equal to half the total length of the PT. Thus, it is clear that Rosen-PT has a practical limitation on design freedom to achieve high ratios of input to output capacitances.

Furthermore, in these previous high voltage Rosen-PTs, there is an inherent power transfer limitation which limits the application of these PTs to applications requiring over 5 W, such as backlighting flat panel displays (FPD), typically requiring 12 W to 24 W. This power transmission limitation is related to the very small coupling area between the input and the output portions of the Rosen-PT, typically the transverse area of the ceramic body in the width direction.

In the other hand, laminated piezoelectric transformers have been proposed recently for step-down applications requiring certain levels of powers. Face Electronics, LC of Norfolk, Va. commercialize piezoelectric transformers of this type able to handle over 60 W of power. However, these transformers operate under step-down transformers and provide only a single output.

The present invention allows for increasing both the output power and the voltage gain by combining in a modular way multiple piezoelectric transformers. In addition, the current invention provides a solution to provide multiple outputs which may have different ratings and may have isolated from the input.

(A) Topologies for Combining Piezoelectric Transformers

Figure 14:
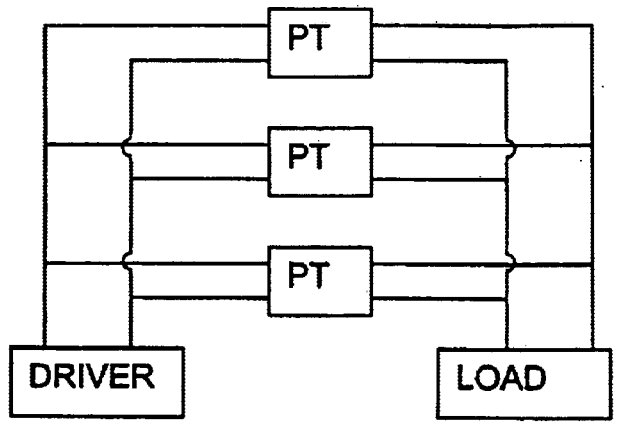
FIG. 14 is a schematic of a direct connection topology for multiple PTs with the outputs in parallel.
Figure 15:
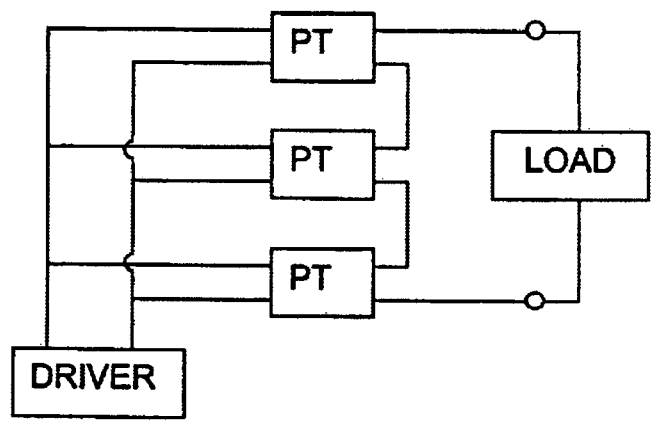
FIG. 15 is a schematic of a direct connection topology for multiple PTs with the outputs in series.
Figure 16:
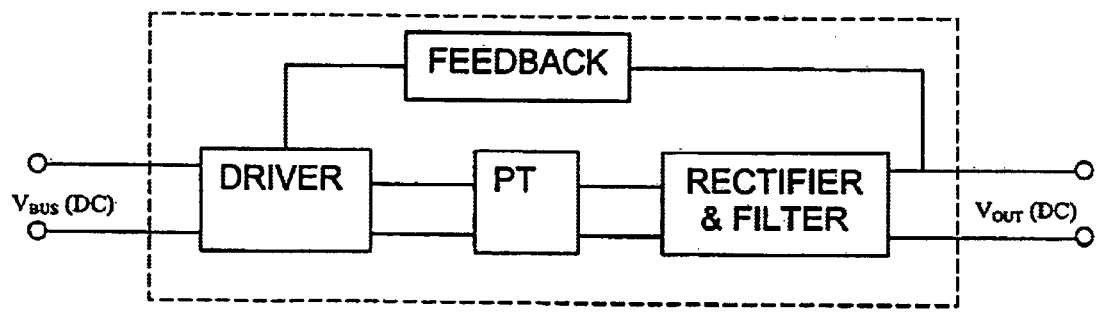
FIG. 16 is a schematic of a modular connection topology for a single PT, forming a module that may be connected to other modules in series or parallel.

Referring to FIGS. 14–16: Two different groups of combining techniques were developed. (a) Direct connection techniques, and (b) modular combining techniques. The preferred topologies are the modular combining techniques due to the higher efficiency and flexibility experimentally achieved.

Referring to FIGS. 14–15: Direct connection is applied when single transformers are available having very small manufacturing tolerances between each others. When piezoelectric transformers with the same dimension, frequency, voltage, and step-up ratio are connected in parallel, the theoretical equations for the single piezoelectric transformer are applicable to the parallel transformer by considering changes in equivalent circuit constants. This development analyzed two different strategies to parallel piezoelectric transformers: a) Two or more single piezoelectric transformers with the input and output connected in parallel as in FIG. 14. In this parallel connection, the two (or more) single piezoelectric transformers have common ground, thus there is no need of using isolation between them; and b) Two or more single piezoelectric transformers with the input connected in parallel and the output connected in series as in FIG. 15. Since these piezoelectric transformers require different grounds, the input and output sections must be electrically isolated from one another.

For these piezoelectric transformers designs where input parts are connected in parallel and output parts connected in series, the input and output layers must be electrically isolated. Previous PT designs have isolated the input from the output by inserting a thin layer of inert material such as Alumina or ceramic. This idea was easily adapted to double layer piezoelectric transformers as in FIGS. 8 and 9. The isolated transformer was tested under different load conditions showing similar behavior to that of the non-isolated version.

From the tests performed, the gain and power performances of the input/output paralleled prototype (Prototype P1) show better performance than the input paralleled/output series prototype (Prototype P2). In particular, efficiency is significantly higher in Prototype P1 and the gain is remarkably increased.

Referring now to FIG. 16: A preferred topology was investigated using modular connections, where a separate driver was used for each PT input portion(s) and the outputs were connected after rectification. Due to the resonant operation of piezoelectric transformers, the direct connection of piezoelectric transformers in parallel or in series leads to significant from a single input power supply leads to a very significant decrease of the efficiency of the overall combination. This is due to the slightly different resonance frequency that each individual PT due to manufacturing tolerances, housing fixture, wiring effects, etc. Due to this reason, if different piezoelectric transformers are directly connected in series or parallel with a single input driver circuit, the result will be the operation of each PT in different points of the gain curve. This results in significant interferences from one transformer to the next one due to the different levels of AC voltage, and significant decrease of efficiency of the overall system.

In order to allow combining single piezoelectric transformers in an efficient way, the present application considers to drive each transformer input individually and connect the output of the transformer after rectifying, so the output is paralleled under DC conditions, rather than AC conditions as in the above described case of direct connection as in FIGS. 14 and 15. The modular connection in the circuit of FIG. 16 includes a transformer having at least one input and at least one output. The input portion(s) are connected to a suitable driver which is powered using a DC voltage or a rectified AC voltage. The output of the PT is rectified, using a rectifier (full-bridge, half-bridge, etc) and filtered, i.e., with one or more capacitors. A feedback system is also preferably included in the module, which uses current or voltage sensing at the output. Comparison of the sensed voltage or current to a reference voltage (or current) provides a signal to the driver, which uses pulse frequency modulation (PFM) or pulse width modulation (PWM) to alter the driving signal to the PT. Thus by using a feedback loop between the output and the driver, the PT may be driven to provide a regulated output, with reference to the reference voltage.

In such a way, each PT circuit includes its own input and output circuitry to operate by itself. We call this a module. Input and output to the module are DC voltages. Different modules can be connected to the same input DC bus voltage to be driven. In addition, different modules can be connected in series to step-up the output voltage to a level proportional to the number of modules used. Furthermore, if the modules have the same output voltage, they can be connected in parallel to increase the output power. In addition, different modules in series or in parallel output connection to provide different levels of output having different voltage and power ratings to drive different loads.

Figure 20:
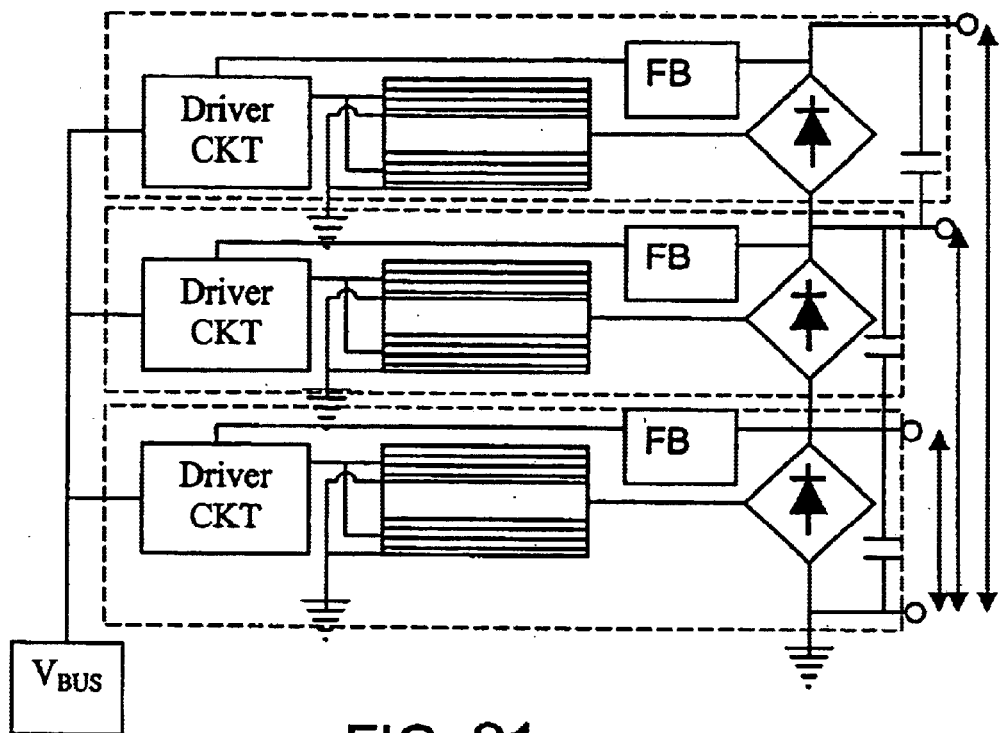
FIG. 20 is a schematic of a circuit used to drive multiple PT modules of FIG. 16 in parallel and providing multiple voltage outputs.
Figure 21:
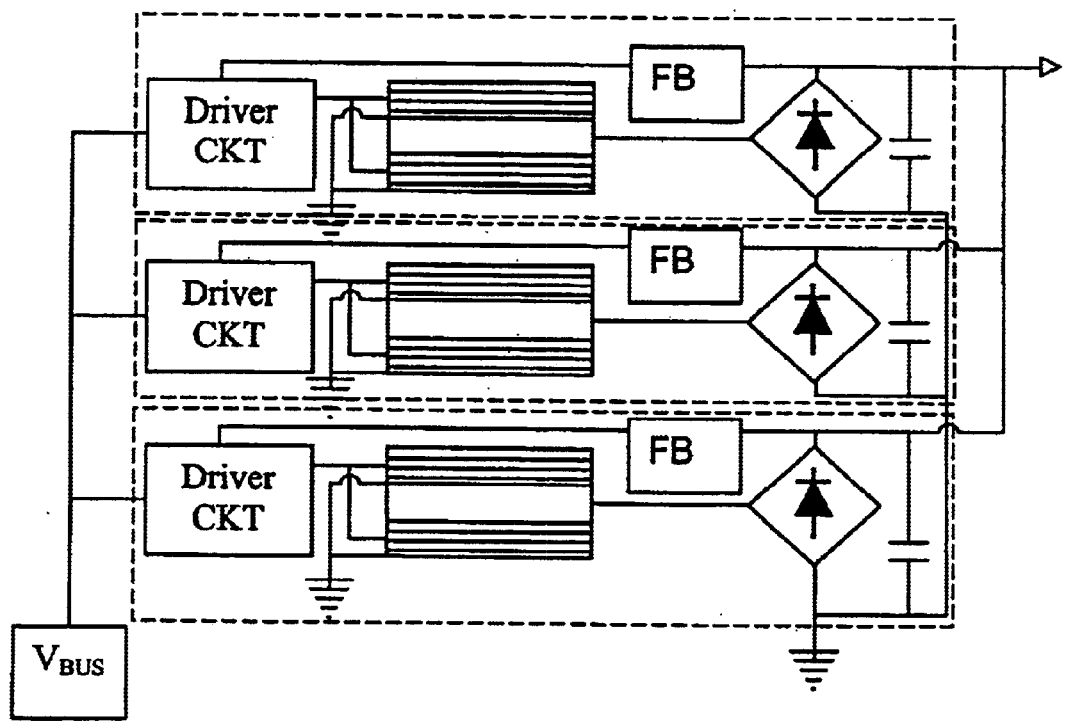
FIG. 21 is a schematic of a circuit used to drive multiple PT modules of FIG. 16 in parallel for providing a series voltage output.

Referring now to FIGS. 20 and 21: Two different topologies for combining single piezoelectric transformers and their equivalent input and output circuitry were developed.

In the first design of FIG. 20, three single laminated longinudinal PTs were connected with the input sections separatelly driven by different input driver circuits and the output sections connected to three different output rectifiers which then are connected in series. In the second design of FIG. 21, the input sections are also driven from different input driver circuits and the output sections were connected to different rectifiers. The output of the rectifiers is then connected in parallel.

In FIG. 20, each of the input sections of the three piezoelectric transformers is driven from an independent driver circuit. Each driver controls the operation of the transformer to the maximum efficiency point. The output of each transformer is connected to a full bridge rectifier having a filter capacitor in his output. Thus, the output of the rectifier is a DC voltage regulated. Each of the transformers considered included isolation between input to the output, thus the outputs are isolated from ground and can be connected in series. In this way, it is possible to increase the DC output voltage in several times by increasing the number of PTs. In this connection, it is not required that each PT provides exactly the same output voltage. Since the series connection is made after rectification there is not interference affecting the transformers.

These second proposed modular design required an output completely isolated from the input. An isolated single layer piezoelectric transformer is described later in this patent.

In FIG. 21, each of the input sections of the three piezoelectric transformers is driven from an independent driver circuit. Each driver controls the operation of the transformer to the maximum efficiency point. The output section of each transformer is then led to a full bridge rectifier which convert the AC output voltage of each PT into a DC output voltage. For parallel connection is required that each driver circuit has a feedback circuit providing regulation of the output voltages to the same value to allow paralleling connection.

Figure 22:
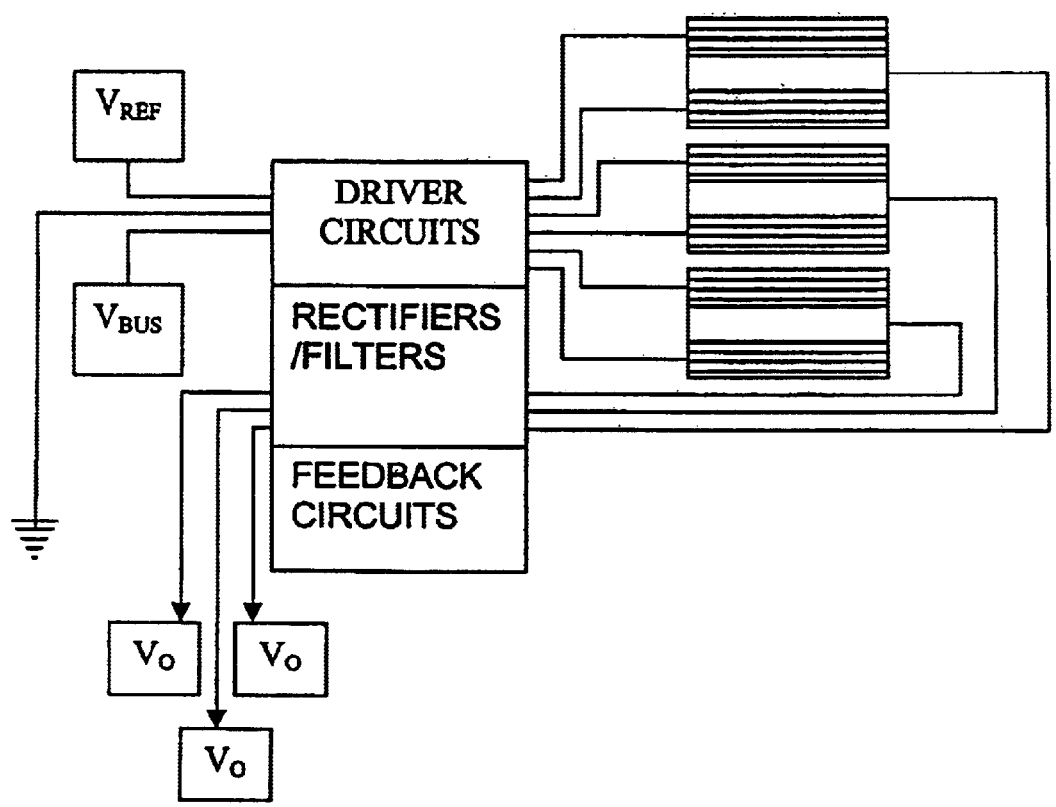
FIG. 22 is a schematic of a circuit used to drive multiple PT modules of FIG. 16 using a singles IC based driver/rectifier/feedback circuit, having multiple drivers therein.

Referring now to FIG. 22: An improved solution for combining piezoelectric transformers is proposed based in the use of an integrating single circuit capable to drive multiple number of piezoelectric transformers independently. In such a topology, the IC is capable to provide different oscillator frequencies to each one of the piezoelectric transformers in a similar way as in the modular connection. The IC also has individual feedback loops for controlling the output signal from eact PT.

(B) The Driver

Figure 17:
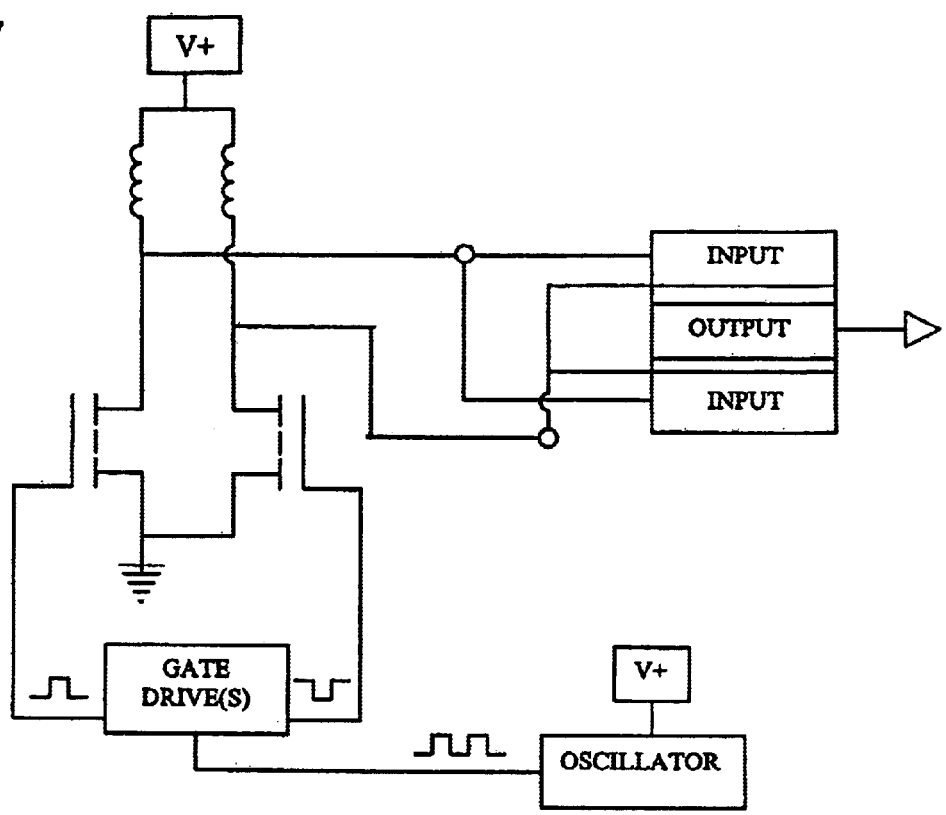
FIG. 17 is a partial schematic of a push-pull circuit used to drive one or more PTs.
Figure 18:
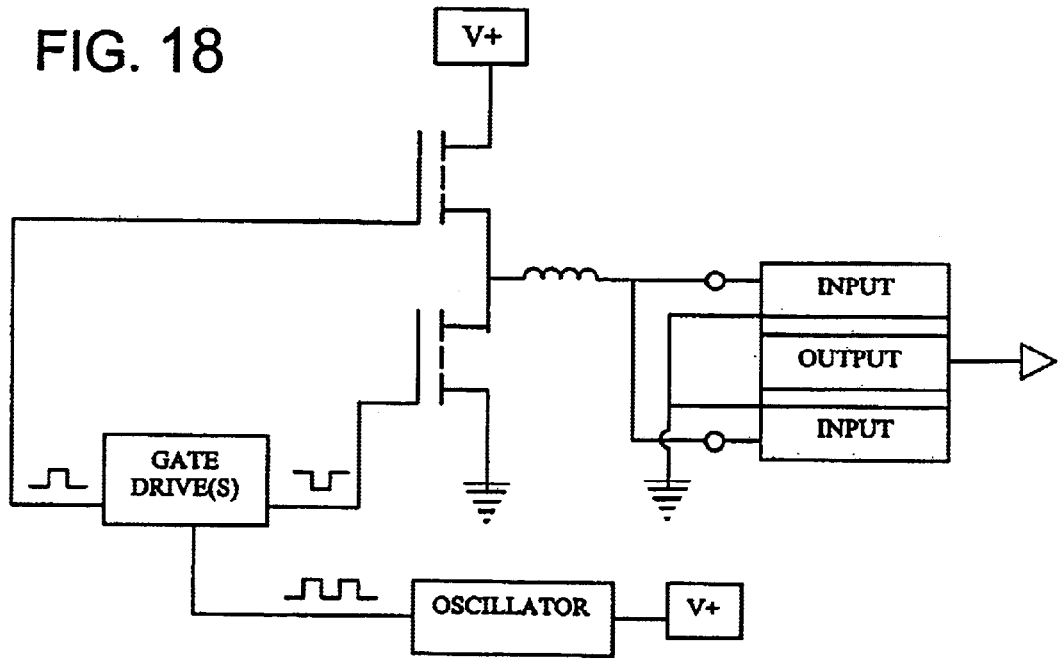
FIG. 18 is a partial schematic of a half-bridge circuit used to drive one or more PTs.
Figure 19:
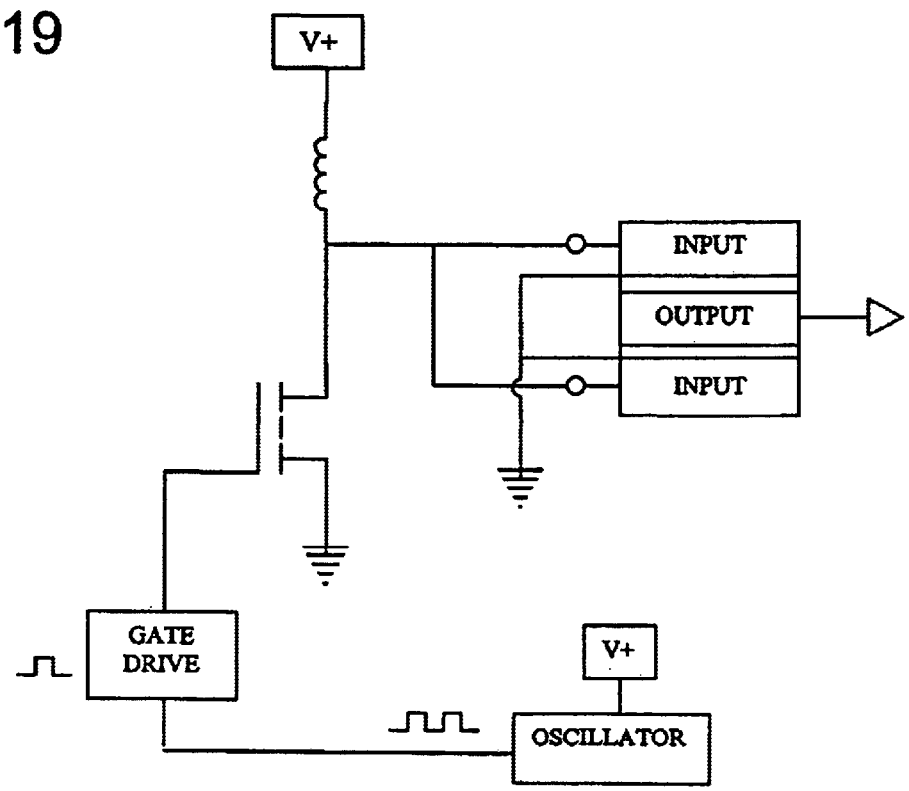
FIG. 19 is a partial schematic of a Class E inverter circuit used to drive one or more PTs.

Referring now to FIGS. 17–19: FIGS. 17–19 show exemplary driver circuits for the PTs 3 described hereinbelow. Basically the driver topology corresponds with the standard DC—DC converters topologies (with isolation) used in the prior state of the art of switching power supplies. Switching DC power supplies, in general, utilize modifications of the following two classes of converters topologies: (a) switching-mode dc—dc converters, where the switches operate in a switch mode, and (b) resonant converters, which utilize zero-voltage and/or zero-current switching techniques. Due to the resonant operation of PTs, the most efficient driver topologies commonly used include mainly resonant converters.

Within the specific group of resonant dc—dc converters topologies, different possibilities can be found, based on the waqy that the PT is driven: (a) Unidirectional excitation, where only a positive input waveform is used to drive the PT, and (b) Bidirectional excitation, where a positive and negative AC signal drive the PT.

The driver of FIG. 17 is a Class D push-pull type driver circuit. The driver of FIG. 18 is a Class D Half-bridge type driver circuit. Both Push-Pull and Half-Bridge driver correspond to the bidirectional excitation family of drivers topologies. The driver of FIG. 19 is a Class E inverter type driver circuit, wich only uses a unidirectional excitation to drive the PT.

In each of the circuits, a PT 3 is shown having two input portions bonded to a central output portion. The PT also has two isolation layers, i.e., a first isolation layer bonded between the first input portion and a first face of the output portion, and a second isolation layer bonded between the second input portion and a second face of the output portion. This provides isolation between the input and output voltages of the PT 3, and also serves to isolate the input grounds from the output grounds if so desired. Each input portion has two electrical terminal, a first input terminal for application of a voltage to the respective input portion, and a second terminal which is connected to ground.

Each of the circuits of FIGS. 17–19 also has a gate driver driven by an oscillator connected to an external voltage source. The voltage source amy also include the output voltage of the PT 3. The oscillator may be selected from conventional oscillators such as a series of inverters, a Phase Locked Loop (PLL), a 555 Timer as well as an integrated circuits (Ics) having an internal oscillator. The output signal of the oscillator is typically a square wave output alternating between 0.0V and 3.3V, and is input into one or more Gate Drives. The gate drive applies a square wave output to one or more switches. In the circuits of FIGS. 15 and 16, the gate drive applies a first square wave voltage signal to the gate of a switching device, herein shown as a first MOSFET Q1. The gate drive also applies the inverse signal to the gate of a second switching device, herein shown as a second MOSFET Q2. The application of the square wave signal and its inverse to the two switches Q1, Q2 creates a circuit wherein when the first MOSFET Q1 is conducting, the second MOSFET does not conduct, and wherein when the first MOSFET Q1 is not conducting, the second MOSFET does conduct. In the circuit of FIG. 17, the gate drive applies a square wave voltage signal to the gate of a switching device, herein shown as a first MOSFET Q3, such that the MOSFET conducts only when the square wave voltage applied to the gate is positive, and does not conduct when zero voltage is at the gate. When the MOSFETS Q1, Q2, Q3 or other switching device has a positive voltage applied to the gate, the switch conducts current across its respective gate from the source (which is connected to other circuit components described herein below) to the drain which is grounded.

Each circuit also comprises at least one inductor connected on one end to a power source, i.e. an external voltage source. When current is allowed to conduct through an inductor, the inductor generates amagnetic field. When the inductor no longer has a path for conduction, the magnetic field collapses and conducts to ground through the switch Q1–Q3 or via the input terminals of the PT 3. Thus, when the gate of a switching device Q1, Q2 or Q3 to which one end of an inductor L1 is attached conducts, the inductor L1 generates a magnetic field. When the gate of a switching device Q1, Q2 or Q3 to which one end of an inductor L1 is attached stops conducting, the magnetic field in the inductor collapses and current flows to the input terminal. The driver circuits of FIGS. 16–17 for the PT 3 each employ different methods of applying the current from the inductor to the input portions of the PT.

Referring again to FIG. 17: The voltage source is connected across each of the input layers to ground via an inductor-transistor pair (L1–Q1 or L2–Q2) depending upon which switching device Q1 or Q2 is closed. Each switch Q1 and Q2 is driven by a gate drive connected to the respective gates G1 and G2. The gate drives operate in conjunction with the oscillator (timer) such that when the gate G1 of the first switch Q1 is de-energized, the gate G2 of the second switch Q2 is energized and vice versa. More specifically, a positive voltage source is provided. Preferably, the voltage source is a DC source such as a battery with a voltage in the range of +3 to +15 VDC. The voltage source may also include a rectified AC voltage source. A voltage regulator may also be included to limit or filter the output voltage signal. The voltage source is linked to the input electrode(s) connected to the first input terminal of the first and second input portions via an inductor L1. The first input terminal is for applying voltage pulses of a first polarity to each input portion of the PT 3. The positive voltage input is also linked to the other input electrode(s) connected to a second input terminal via a second inductor L2. The second input terminal is for applying voltage pulses of a second polarity to the input portions of the transformer 3. Thus, the polarity of the voltage applied to the transformer 3 is positive when applying a voltage to the first input terminal while the second input terminal is connected to ground. Due to polarization of the input layer(s), the polarity of the voltage applied to the transformer 3 is reversed, i.e., negative when applying the same voltage to the second input terminal while the first input terminal is connected to ground.

A switching device, e.g., a transistor such as a FET, IGBT or BJT, but most preferably a MOSFET is connected to each input terminal. More preferably, a dual N-channel power MOSFETs with internal diodes in parallel with each switching transistor is used. Examples of chips incorporating such transistors include the chip NDS9945 as manufactured by Fairchild Semiconductor, and more preferably integrated circuits of the family 397X, manufactured by Texas Instruments. More specifically, the source S1 of a MOSFET Q1 is electrically connected to inductor L1 and input terminal 61. The drain D1 of the MOSFET Q1 is connected to ground. This places the input portions of the transformer 3 in parallel with the source S1 and drain D1 of the first MOSFET Q1. Also, the source S2 of a second MOSFET Q2 is electrically connected to inductor L2 and input terminal 62. The drain D2 of the MOSFET Q2 is connected to ground as are the ground wires of the transformer 6. This places the input portions of the transformer 3 in parallel with the source S2 and drain D2 of the second MOSFET Q2.

Each switching device (MOSFETs Q1 and Q2) has a gate drive connected to their respective gates G1 and G2. The preferred gates drives comprise a dual high speed power MOSFET gate driver chip U2. The gate drives operate in conjunction with an oscillator (timer) 230 such that when the gate G1 of MOSFET Q1 is de-energized, the gate G2 of MOSFET Q2 is energized and when the gate G2 of MOSFET Q2 is de-energized, the gate G1 of MOSFET Q1 is energized. When the gate G1 of the first MOSFET Q1 is energized, current will flow from the source S1 to the drain D1. When the first MOSFET Q1 is de-energized, the magnetic field in the inductor L1 collapses and a positive voltage pulse is applied to input terminal 61, which causes the input portions of the transformer 3 to deform in a first direction, i.e., expand. Also, when the gate G2 of the second MOSFET Q2 is energized, current will flow from the source S2 to the drain D2. When the second MOSFET Q2 is de-energized, the magnetic field in the inductor L2 collapses and a positive voltage pulse is applied to input terminal 62, which causes the input portions of the transformer 3 to deform in the opposite direction, i.e., contract. An example of a suitable driving device for driving the gates is the Telcom TC4428 dual gate driver U2 by Microchip, which is an integrated device that can easily switch gates G1 and G2 having large capacitances with high speed. Most preferably, a device for driving the gates which includes both the oscillator and the driver in one IC is of the family 3977, manufactured by Texas Instruments.

As mentioned above, the driver(s) send one signal to the gate G1 of the first switching device Q1, and the inverse signal to the gate G2 of the other switching device Q2. To develop these two signals, the driver uses as a source an oscillating signal generated by a timer/oscillator. The oscillator may be constructed in many ways, including but not limited to: (a) a CMOS inverter-based oscillator; (b) a commercial timer, such as an LMC555 or LTI555 by National Semiconductor; and (c) other similar voltage converter oscillator (VCO) topology. An example of the preferred appropriate oscillator is a 555 DC/AC timer. In general, the oscillator has an output pin for transmitting an oscillating voltage signal which is electrically connected to the input pin of the driver. The oscillator is preferably configured as a 50 percent duty driver. Thus, the output of the oscillator is a square wave oscillating between ground and a positive voltage of 3–15 VDC. The initial frequency of the square wave (preferably approximately 500 kHz) is set according to the Z constant determined by the combination of resistor and capacitor connected in parallel to the input pins of the oscillator designed therefor. More specifically, the trigger pin is connected to the threshold pin and the resistor is connected between the trigger pin and the output pin, whereas the capacitor has one end grounded and the other end connected between the resistor and the threshold pin. To determine or adjust the initial oscillator frequency, a potentiometer may be used in place of the resistor, which may then be replaced with fixed resistor after the circuit is adjusted to the open circuit resonant frequency of the PT 3. The oscillator is powered by an external power source such as the voltage source ranging, for example, from +3 to 15 volts DC. Most preferably, a single device for driving the gates which includes both the oscillator and the driver in one IC is of IC type UCC3977, manufactured by Texas Instruments.

In operation, each transistor gate G1 and G2 is connected to the driver that alternately energizes each gate G1 or G2. When a positive voltage signal from the driver is applied to the gate G1 of the first switching device Q1, the gate G1 turns on and the switching device Q1 conducts from the source to the drain. This allows current to conduct through inductor L1 to ground across the input portions and through the switch Q1. Conversely, when a positive voltage signal from the driver is applied to the gate G2 of the first switching device Q2, the gate G2 turns on and the switching device Q2 conducts from the source to the drain. This allows current to conduct through inductor L2 to ground across the input portions and through the switch Q2.

Thus, depending on which switch Q1 or Q2 is energized, the circuit is connected across the input portions through L1 and Q1 or through L2 and Q2. Due to the inductance of inductors L1 and L2, and capacitance of the input portions of the PT 3 (as well as the drain to source capacitances of the switching devices Q1 and Q2), the circuit behaves as a resonant circuit. Consequently the square wave DC voltage input becomes a sinusoidal input to the PT 3. The PT 3 has step-up ratio and power capabilities determined by its shape, size and number of input and output layers, and its piezoelectric characteristics. In order to achieve the best step-up and power capabilities, it is desirable to idealize this sinusoidal input signal. This may be achieved through Zero Voltage Switching (ZVS) described below.

In operation, the PT 3 is driven by a switched DC voltage resulting from the on/off operation of the switching transistors Q1 and Q2. Due to the high frequency associated with the converters, Zero Voltage Switching (ZVS) operation is particularly preferable. The switching transistors Q1 and Q2 are alternately turned on and off with a short dead time. During the short dead time, magnetizing current charges and discharges the drain to source capacitance of the switches Q1 and Q2, as well as the input capacitance of the PT 3. As a result, ZVS of these switches Q1 and Q2 is achieved. The inductance of each of the inductors L1 and L2 is selected to achieve ZVS by ensuring the resonance between the inductors L1 and L2 and the capacitance of the input portions of the PT 3 as well as the drain to source capacitance of the switches Q1 and Q2.

Thus, by having the oscillator and gate drive alternatingly driving the gates G1 and G2 of FETs Q1 and Q2 such that one gate G1 or G2 is on while the other is off, a series of positive voltage pulses may be alternatingly applied to the input terminals T1 and T2 of the transformer 3 to alternate the polarity of the voltage across the input portions and drive the transformer 3 in a push-pull mode. When driving the transformer 3, it is preferable to drive the PT 3 at its natural resonant frequency. This is because greater deformation of the layers occurs while operating at resonance and therefore, greater voltage gains are realized. Thus, it is preferred to apply the voltage inputs at a frequency corresponding to the natural radial resonant frequency of the PT 3 which is in the range of 490–510 kilohertz.

As the input portions of the PT expand and contract, the output portion likewise expands and contracts generating an alternating high voltage. This circuit provides a one hundred per cent duty cycle for driving the push-pull input portions of the transformer 3. Furthermore, the drive circuit has to support only half the current resulting in lower losses, greater efficiency and lower cost components.

Referring now to FIG. 18: The PT 3 may also be driven using a FET half-bridge circuit of the type illustrated. Whereas the push-pull circuit of FIG. 16 uses two switching devices connected in parallel, the present half-bridge circuit uses two switching devices Q1 and Q2 connected in series between the voltage source and ground. Specifically, the first switching device Q1, called the low-side transistor Q1, has a gate, a source and a drain, wherein the drain is connected to ground and the gate is connected to one output of the gate driver. The source of the Low-side switch Q1 is connected to the drain of a second switching device Q2, the High-side transistor Q2. The gate of the High-side switch Q2 is connected to the second, inverse output of the gate driver, and the source is connected to the external voltage source. The, the High-side and Low-side switches Q2, Q1, form FET half-bridge. Like the push-pull driver, the switches Q1, Q2 operate inversely of each other, i.e., Q1 is energized when Q2 is deenergized, and Q1 is deenergized when Q2 is energized. At the junction of the half-bridge, i.e., at the Q2 drain-Q1 source junction, is connected one end of and inductor L. The other end of the inductor is connected to one input terminal connected to the input portion(s) of the PT 3. The second input terminal of the PT 3 is connected to ground.

In operation, when the High side switch Q2 conducts, the voltage source is connected across the inductor to the input terminal and to ground across the input portions. This corresponds to a positive voltage applied across the electrodes of the input portions, which causes the input portions to deform. As the current conducts across the inductor, a magnetic field is generated by the inductor. When the High-side switch Q2 stops conducting, and the Low-side switch Q1 is energized, the inductor is connected to ground via the Low-side switch Q1. When no longer connected to the voltage source, the magnetic field in the inductor collapses and current flows to ground through the Low-side switch Q1. As the current flows away from the input terminal of the PT 3, it corresponds to a voltage of opposite polarity across the electrodes of the input portion, and the input portions of the PT 3 deform in the opposite direction.

Referring now to FIG. 19: In the driver topology of FIG. 19, the Class E inverter circuit essentially functions as a half bridge driver with only a Low side switch Q3. The inductor is connected on one end to a voltage source. The opposite end of the inductor is connected to the gate of the switch Q3 and to the input of the PT 3. The drain is connected to ground and the gate is connected to the driver which applies a square wave to the gate, alternatingly energizing and deenergizing the gate of the Switch Q3. When the switch Q3 is closed, current flows through the inductor to the input terminal and applies a positive voltage to across the elecrodes of the input portions, until the magnetic field generated by the inductor reaches its maximum value, at which point the current no longer conducts. When the swutch Q3 is opened, the magnetic field collapses and the inductor current conducts to ground through the switch. Once the magnetic field is collapsed, the inductor may act as a path across which current may flow to the input terminal when the switch Q3 is again closed. Thus the positive voltage is applied across the input portions in a half cycle through the inductor when the switch is Q3 is closed, and negative voltage is applied across the input portions in a half cycle through the collapse of the inductor field inductor when the switch is Q3 is open.

(C) Preferred Piezoelectric Transformer

In the present invention, a laminated piezoelectric transformer using the longitudinal mode resonant vibrations for step-up voltage and high power conversion applications.

The present invention allows for increasing gain by increasing the capacitance ratio of the input and the output sections. In addition, the current invention provides a solution to scale-up the power levels by selecting the thickness dimensions of the input and the output layers as well as the number of layers in the input portion.

A high voltage PT is provided which has high voltage output while still providing a low profile device. A low profile device is necessary because as the ratio of the thickness to the length of a PT approaches unity, the longitudinal resonance mode and the thickness resonant mode vibrations interfere with each other. The present configuration of PT minimizes the interference of resonant modes with the following design.

Figure 7:
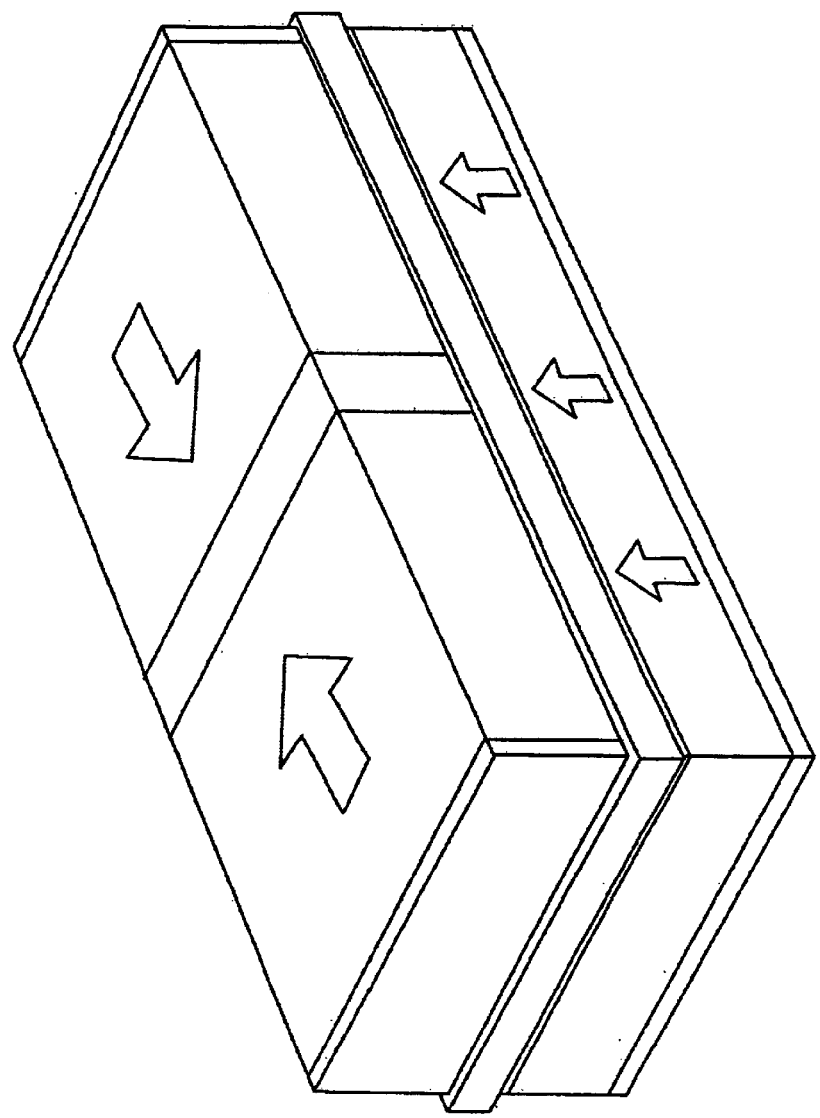
FIG. 7 is a perspective view of an early embodiment of a laminated piezoelectric transformer with a bar-shaped configuration, single output and input portions, and surface ring central electrode of the prior art.

Referring now to FIG. 7: An early embodiment of such a PT 1 comprises an input layer 60 comprising a thin layer of an electroactive material, with electrodes (silver and/or nickel) electro-deposited thereon. The input layer 60 is polarized in the thickness direction 51, and deforms along the plane orthogonal to the thickness direction. The PT 1 also comprises an output layer 40 comprising another rectangular bar-shaped layer of electroactive material. The output layer 40 is bisected by a central output electrode 45 defining two substantially equal portions 41 and 42 of the output layer 40. The output portions 41 and 42 are each poled in the longitudinal direction 52, between each outer electrode 44 and 46 towards the central electrode 45. The input layer 60 and output layer 40 are bonded to opposing sides of an insulator layer 50, which insulates the high voltage electrode 45 from the electrode 61 of the input layer 60. When the input layer 60 deforms under an applied voltage, the deformation is transmitted through the insulator layer 50 to the output layer 40, thus generating a voltage between the output ground electrodes 44 and 46 and the central high voltage electrode 45.

One of the drawbacks associated with this earlier PT design is that the structure is not symmetric in the thickness direction. Because the input portion is bonded to one face of the output portion, the affect of the vibration of the input portion differs on each face of the output portion. The affect of the input portion on the output portion is to cause one or more bending and torsional modes of operation (rather than the preferred longitudinal mode). The bending and torsional modes actually interfere with the main longitudinal mode, and thus diminish the performance and efficiency of the PT. The bending modes include the first simple bending mode, and a second more complex bending mode. The frequency of the second bending mode is also very close to the frequency of the longitudinal mode, and thus may cause even greater interference with the longitudinal mode of operation of the PT.

Another drawback of the earlier design in the PT of FIG. 7 is that the bending spurious modes tends to create de-lamination of the bonding interface between input and output portion and thus resulting in the complete failure of the PT.

Another drawback of the earlier design in the PT of FIG. 7 is that polarization of the output portion is complicated. This is because the central electrode "band" is on the surfaces of the output layer. When a potential is applied between the central electrode and the outer electrodes, the polarization is mainly on the surface of the ceramic layer, which diminishes the performance of the PT. It is preferable for the polarization of the output portion between the central electrode and the outer electrodes to be uniformly and homogeneously distributed throughout the volume of the output layer. The designs of the PTs described herein below overcome the problems associated with surface poling and spurious bending/torsional modes.

Referring now to FIG. 8: An improved design of such a PT 2 comprises two input layers 60 and 70 each comprising a thin layer of an electroactive material, preferably a piezoelectric material such as PZT, PZT-PSM, PZT-PZN-PSN system, PZT-PZN-PSN with different doping elements or combinations therof. Preferably, when restricted to a specified width of transformer, the input layers 60 and 70 are rectangular or bar-shaped. The input layers 60 and 70 are also preferably substantially longer than they are wide, (for example 1.5 times, and preferably 3 or more times as long), and substantially wider than it is thick (for example 1.5 or more times wider). These dimensions ensure that the device's resonant frequency is the lower frequency longitudinal mode related to the length of the device rather than to the width or thickness of the device.

Each input layer 60 and 70 has electrodes deposited on their respective major faces. Electrodes 61 and 62 are provided on the two major faces of the first input layer 60 and electrodes 71 and 72 are provided on the two major faces of the second input layer 70. The electrodes 61, 62, 71 and 72 preferably comprise a metallization of silver, platinum, palladium, copper, zinc, nickel, or combinations thereof, that are sintered with and onto each of the major faces of the input layers 60 and 70. Alternately, the electrodes 61, 62, 71 and 72 may be screen printed, vapor deposited or mechanically bonded to each face of the ceramic layers 60 and 70. Where a bonding is used, the electrodes 61, 62, 71 and 72 preferably each comprise a foil layer of copper, zinc, nickel, silver, platinum or combinations thereof. Bonding of the input layers 60 and 70 to the electrodes 61, 62, 71 and 72 is preferably achieved with an ARALDITE-type single component epoxy-based adhesive such as "AV-118" (AV118) manufactured by Vantico, Inc., a division of Ciba Specialty Chemicals Corporation, N.A. of East Lansing, Mich., or similar epoxies such as "Ciba-Geigy AV118" (AV118) manufactured by the same or similar epoxies such as Eccobond G909 manufactured by Emerson and Cuming, of Canton, Mass.

Each of the input layers 60 and 70 is polarized in the thickness direction, i.e., in a direction perpendicular to the input electrodes 61 and 62, 71 and 72 on the major faces of the respective input layers 60 and 70 as indicated by arrows 51 and 53. This polarization is such that when a voltage is applied across the input electrodes 61 and 62, the first input layer 60 will deform in the longitudinal direction, i.e., a d31 mode deformation in a direction parallel to the planes of electrodes 61 and 62, and primarily along the longer dimension (length) in that plane. Also, when a voltage is applied across the input electrodes 71 and 72, the second input layer 70 will deform in the longitudinal direction, i.e., a d31 mode deformation in a direction parallel to the planes of electrodes 71 and 72, and primarily along the longer dimension (length) in that plane.

Figure 10:
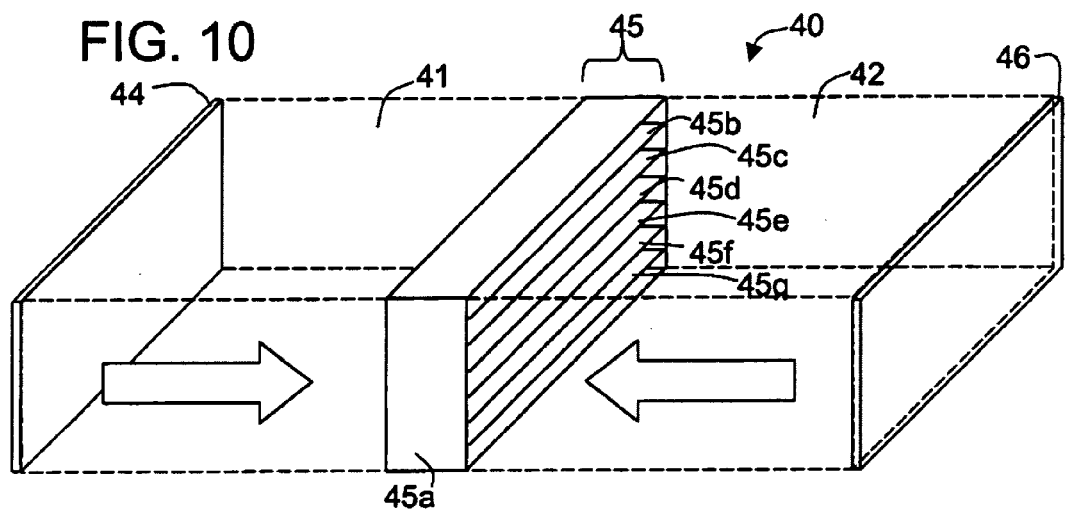
FIG. 10 is a perspective view of the preferred multilayer construction of the output layer of the PT in FIG. 9 with the ceramic portions in ghost and using internal electrodes for the central electrode portion.

Referring to FIGS. 8–10: The output layer 40 of the PT 3 comprises another rectangular bar-shaped layer of electroactive material, preferably PZT. The electroactive material if the output portion 40 may also comprise a piezoelectric material such as PZT, PZT-PSM, PZT-PZN-PSN, and PZT-PZN-PSN with different doping elements or combinations thereof. Preferably, the thickness of the output layer 40 is relatively greater than the thickness of the input layer 60. The output layer 40 is bisected by a central output electrode section 45 thus defining two substantially equal portions 41 and 42 of the output layer 40. In one embodiment of the invention, the output layer 40 comprises a single bar of PZT with a central electrode section 45 comprising a band 45a bonded to and/or wrapped around the central circumferential surface of the bar. However, the output layer 40 may alternatively comprises two separate pieces 41 and 42 of PZT which are bonded at a minor face to the central electrode section 45 which is in the form of a metallic sheet or electrode plate. Two outboard output electrodes 44 and 46 are bonded on the two minor faces of the output layer 40 that are parallel to the central electrode section 45. The electrodes 44, 45 and 46 preferably comprise copper foil bonded to the output layer 40 using AV118 adhesive.

Referring again to FIG. 10: However, in the preferred embodiment of the invention, the central electrode section 45 comprises not only a circumferential band 45a, but also one or more internal electrodes 45b–g. The internal electrodes 45b–g may be manufactured by screen printing metallizations as described hereinabove about the centers of multiple ceramic tapes, which are then sintered together to form a unitary block of PZT having internal electrodes 45b–g along the interior of the ceramic in the central electrode section 45 of the output layer 40. The advantage of having a band 45a and internal electrodes 45b–g, is in the poling process for the output portions 41 and 42. For a simple band 45a without internal electrodes 45b–g, as poling voltages are applied between outer electrodes 44 and 46, and electrode section 45, the poling of the output portions 41 and 42 is primarily at the surface of the output portions 41 and 42. With the additional internal electrodes 45b–g, the output sections 41 and 42 are poled more homogeneously throughout the ceramic layer 40 due to the relative greater ease of travel of the voltage from the outer electrodes 44 and 46 to the center electrodes 45a–g. The homogeneous poling of the output sections 41 and 42 allows greater voltages to be generated and increases the overall efficiency of the PT 2.

Referring again to FIG. 8: The output layer 40 is also bonded, preferably using AV118 adhesive on each major face to the remaining major faces of the insulating layers 50 and 55. Thus, in the preferred embodiment of the invention, the central electrode section 45 is essentially a conductive band 45a that wraps around the output layer 40 between the output portions 41 and 42 with or without underlying internal electrodes 45b–g, and in the alternative embodiment of the invention the central electrode 45 actually physically separates the two output portions 41 and 42 of the output layer 40 from each other.

Each portion 41 and 42 of the output layer 40 is preferably polarized between its respective outboard electrode 44 or 46 towards the central electrode section 45. This provides for an output layer 40 with output portions 41 and 42 that are poled longitudinally (parallel to the major face) with respect to the input layers 60 and 70. The output portions 41 and 42 are actually poled in the thickness direction with respect to the poling direction between their respective output electrodes 44 and 45 or 46 and 45. The output portions 41 and 42 are preferably both poled towards the central output electrode 45 as indicated by arrows 52, i.e., the positive poling potential is applied at the central electrode 45. With this poling, when a voltage is applied between electrodes 44 and 45 or between electrodes 46 and 45, the output portion 41 or 42 between those electrodes will expand or contract (depending on the polarity) between the electrodes and parallel to the direction of poling ($d33$ deformation). Conversely, when the output portions 41 and 42 of the output layer 40 are strained under a compressive or tensile force, a voltage is generated between the output electrodes 44 and 45 and electrodes 45 and 46. It is also possible to polarize each portion 41 and 42 from the central electrode toward its respective electrode 44 or 46.

Figure 6:
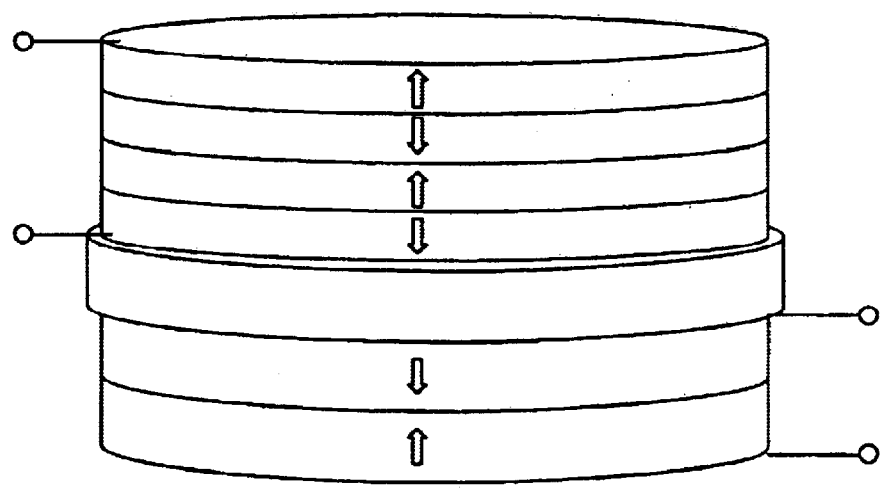
FIG. 6 is an elevation view of a laminated radial mode piezoelectric transformer.

The PT 2 also comprises first and second insulator layers 50 and 55 bonded to each major face of the output layer 40, as well as to a major face of each input layer 60 and 70. The insulator layers 50 and 55 each preferably comprises a layer of alumina or silica glass, i.e., dielectrics having a low dielectric constant, preferably $\in<10$. As illustrated in FIG. 6, an electrode 61 or 62 of the input layer 60 is bonded to a face of the first insulating layer 50, and an electrode 61 or 72 of the input layer 70 is bonded to a face of the second insulating layer 50, each preferably using AV118 adhesive. The alumina layers 50 and 55 prevent the input electrodes 61 or 62, 71 or 72 from contacting any of the high voltage central output electrode section 45. The insulator layers 50 and 55 extend to the edges of the input electrodes 61 or 62, 71 or 72 to which they are bonded.

Referring again to FIG. 8: In the preferred embodiment of the PT 2, the outboard input electrodes 62 and 72 are connected to an input terminal 65. The input electrodes 61 and 71 bonded to the insulators 50 and 55 are connected to ground as are the outboard output electrodes 44 and 46. Output electrode 45 is connected to output terminal 47. In order to simplify the ground connections, the output ground electrodes 44 and 46 preferably are electrically in contact with the ground input electrode 61 and 71. This may be accomplished by having a conductor extending from the output ground electrodes 44 and 46 to the input ground electrodes 61 and 71. In one embodiment this may be facilitated using insulator layers 50 and 55 that extend only as far as the output ground electrodes 44 and 46, and extending the length of the output ground electrodes 44 and 46 to contact the input ground electrodes 61 and 71 respectively. In a preferred embodiment, common ground connections may be facilitated using insulator layers 50 and 55 that extend out to the output ground electrodes 44 and 46, and have a metallic conductor bonded to each end between the output ground electrodes 44 and 46 to contact the input ground electrodes 61 and 71.

In operation, application of a voltage of a first polarity to input terminal 65 across the electrodes 61 and 62 of the input layer 60 causes a longitudinal $d31$ deformation (contraction) of the ceramic layer 60, which in turn deforms (contracts) the attached insulator layer 50 and output layer 40. Likewise, application of a voltage of a first polarity to input terminal 65 across the electrodes 71 and 72 of the input layer 70 causes a longitudinal $d31$ deformation (contraction) of the ceramic layer 70, which in turn deforms (contracts) the attached insulator layer 55 and output layer 40. The thickness deformation (contraction) of the output portions 41 and 42 of the output layer 40 piezoelectrically generates an output voltage of a first polarity in the $g33$ mode, between the grounded output electrodes 44 and 46 and the central output electrode section 45, which is connected to output terminal 47. Conversely, application of a second voltage of a second opposite polarity to input terminal 65 across the electrodes 61 and 62, and 71 and 72 of the respective input layers 60 and 70 causes a longitudinal $d31$ mode deformation (expansion) of the ceramic layers 60 and 70, which in turn deforms (expands) the attached insulator layers 50 and 55 and output layer 40. The thickness deformation (expansion) of the output portions 41 and 42 of the output layer 40 piezoelectrically generates an output voltage of a second opposite polarity in the $g33$ mode, between the grounded output electrodes 44 and 46 and the central output electrode section 45, which is connected to output terminal 47. Thus, application of an alternating voltage to the input layers 60 and 70 causes the input layers 60 and 70 to deform (in the $d31$ mode), which causes the attached insulator layers 50 and 55 and output layer 40 to deform (in the $g33$ mode), thereby generating an alternating output voltage.

Referring to FIGS. 9–13: The most preferred embodiment of a PT 3 is illustrated showing an improved design to the input portions 110 and 120 as well as to the ground connections. This PT 3 has an output layer 40 as described hereinabove and detailed in FIG. 8, comprising a bar of electroactive material having two outer ground electrodes 44 and 46 as well as a central high voltage electrode section 45 comprising an outer band 45a and internal electrodes 45b–g. The improvement in the PT 3 lies in using a multilayer construction for the input portions 110 and 120 as well as an electrode configuration for the ground connections for the input 110 and 120 and output portions 40.

Referring again to FIGS. 9 and 11: The input portions 110 and 120 comprise a plurality of individual input layers. More specifically, input portion 110 preferably comprises four thin input layers 112, 114, 116 and 118 of an electroactive material. Also, input portion 120 preferably comprises four thin input layers 122, 124, 126 and 128 of an electroactive material. Preferably, the electroactive material if the input portions 110 and 120 comprises a piezoelectric material such as PZT, PZT-PSM, PZT-PZN-PSN, and PZT-PZN-PSN with different doping elements or combinations thereof. Preferably, when restricted to a specified width of transformer, the input layers 110 and 120 are rectangular or bar-shaped rather than circular in order to take advantage of the lower resonant frequency longitudinal mode. The input portions 110 and 120 are also preferably substantially longer than they are wide, (for example 1.5 times, and preferably 3 or more times as long), and substantially wider than it is thick (for example 1.5 or more times wider). These dimensions ensure that the device's resonant frequency is the lower frequency longitudinal mode related to the length of the device rather than to the width or thickness of the device.

Each input layer 112, 114, 116 and 118, and 122, 124, 126 and 128 of respective input portions 110 and 120 has electrodes deposited on their respective major faces. More specifically, input layer 112 has electrodes 111 and 113 deposited on it major faces. Electrode 113 contacts a major face of layer 114, and electrode 115 is deposited on the opposite major face of layer 115. Electrode 115 contacts a major face of layer 116, and electrode 117 is deposited on the opposite major face of layer 116. Electrode 117 contacts a major face of layer 116, and electrode 119 is deposited on the opposite major face of layer 118. Likewise, in the second input portion: input layer 122 has electrodes 121 and 123 deposited on it major faces; electrode 123 contacts a major face of layer 124, and electrode 125 is deposited on the opposite major face of layer 125; electrode 125 contacts a major face of layer 126, and electrode 127 is deposited on the opposite major face of layer 126; and electrode 127 contacts a major face of layer 126, and electrode 129 is deposited on the opposite major face of layer 128.

The electrodes 111, 113, 115, 117 and 119, and 112, 123, 125, 127 and 129 preferably comprise a metallization of silver, platinum, palladium, copper, zinc, nickel, or combinations thereof, that are sintered with and onto each of the major faces of the input layers 112, 114, 116 and 118, and 122, 124, 126 and 128 of respective input portions 110 and 120. Alternately, the electrodes 111, 113, 115, 117 and 119, and 112, 123, 125, 127 and 129 may be screen printed, vapor deposited or mechanically bonded to each respective face of the ceramic layers 112, 114, 116 and 118, and 122, 124, 126 and 128. Where a bonding is used, the electrodes 111, 113, 115, 117 and 119, and 112, 123, 125, 127 and 129 preferably each comprise a foil layer of copper, zinc, nickel, silver, platinum or combinations thereof. Bonding of the input layers 112, 114, 116 and 118, and 122, 124, 126 and 128 to the electrodes 111, 113, 115, 117 and 119, and 112, 123, 125, 127 and 129 is preferably achieved with an ARALDITE-type single component epoxy-based such as "AV-118" (AV118) manufactured by Vantico, Inc., a division of Ciba Specialty Chemicals Corporation, N.A. of East Lansing, Mich., or similar epoxies such as Eccobond G909 manufactured by Emerson and Cuming, of Canton, Mass.

Each of the input layers 112, 114, 116 and 118, and 122, 124, 126 and 128 of respective input portions 110 and 120 is polarized in the thickness direction, i.e., in a direction perpendicular to the input electrodes 111, 113, 115, 117 and 119, and 112, 123, 125, 127 and 129 on the major faces of the respective input layers 112, 114, 116 and 118, and 122, 124, 126 and 128 indicated by arrows 151 and 153. In the preferred embodiment of the invention, the direction of poling 151 or 153, alternates at each input layer 112, 114, 116 and 118, and 122, 124, 126 and 128 of respective input portions 110 and 120. Also, in the preferred embodiment, each electrode 111, 113, 115, 117 and 119, and 112, 123, 125, 127 and 129 is preferably alternatingly connected to ground or the input voltage. Most preferably, the ground electrodes are the outside electrodes 111, 115 and 119, and 121, 125 and 129, and the input voltage is applied to electrodes 113, 117, 123 and 127. The electrode connections and polarization is such that when a voltage is applied across input electrodes 111 and 113, for example, the input layer 112 deforms in the longitudinal direction, i.e., a d31 mode deformation in a direction parallel to the planes of electrodes 111 and 113, and primarily along the longer dimension (length) in that plane. Likewise, when a voltage is applied across the input electrodes 121 and 123, input layer 122 will deform in the longitudinal direction, i.e., a d31 mode deformation in a direction parallel to the planes of electrodes 121 and 123, and primarily along the longer dimension (length) in that plane. The alternate poling of the layers and alternating connection of the input and ground electrodes ensures that all input layers deform in the same direction, i.e. expand or contract simultaneously.

Figure 11:
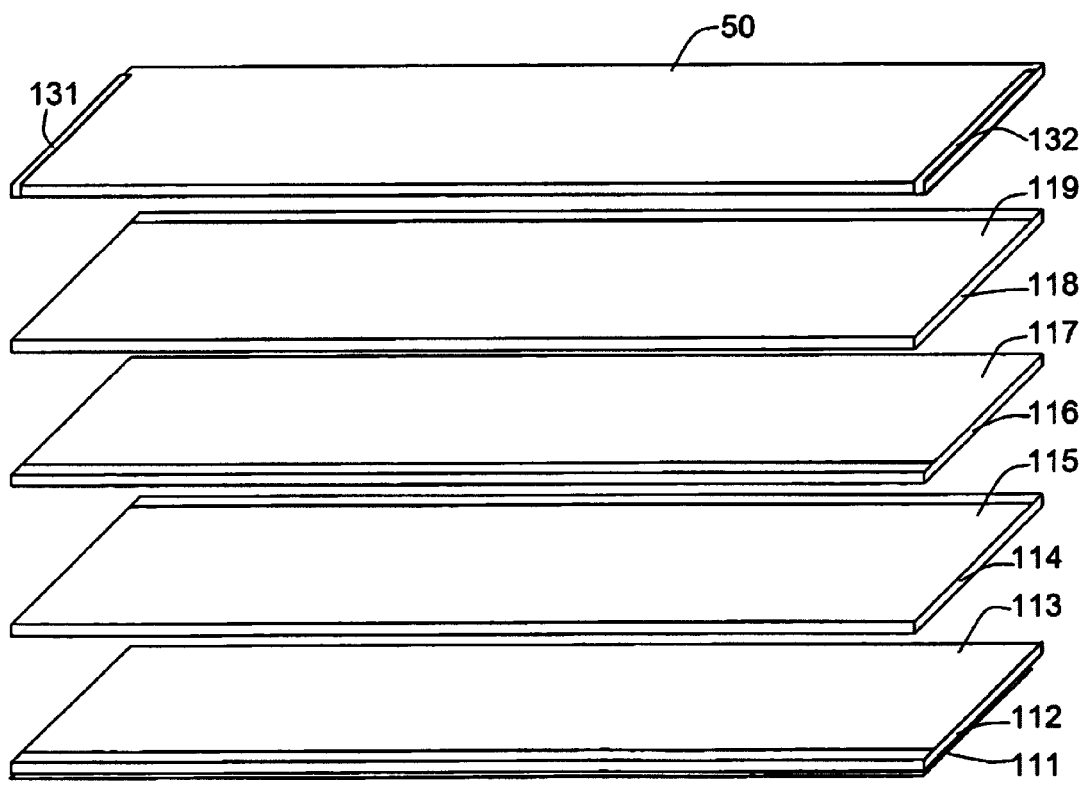
FIG. 11 is a blown up perspective view of an isolation layer and input layers of the PT in FIG. 9 showing the electrode belts and patterns.

Referring now to FIGS. 11-13: To facilitate the application of a voltage across the layers of the input portions 110 and 120, the electrodes in each input portion 110 and 120 are preferably interdigitated. More specifically, when constructing an input portion 110, such as in FIG. 9, each ceramic layer 112, 114, 116 and 118 comprises a thin tape of piezoelectric material. Electrodes 111, 113, 115, 117 and 119 comprising metallizations are screen printed on each layer 112, 114, 116 and 118 in a preferred pattern to provide interdigitation. Specifically, layers 112 and 116 have electrodes 113 and 117 respectively applied to the majority of their inboard major faces (the faces closest to the output portion 40), extending from a first edge (along the length dimension) and leaving a blank strip 112a and 116a of unelectroded ceramic along the second edge of the ceramic layers 112 and 116. Conversely, layers 114 and 118 have electrodes 115 and 119 respectively applied to the majority of their inboard major faces (the faces closest to the output portion 40), extending from the second edge (along the length dimension) and leaving a blank strip 114a and 118a of unelectroded ceramic along the first edge of the ceramic layers 114 and 118. Input ceramic layer 112 also has an electrode 111 applied to the majority of the outboard major face (the face furthest from the output portion 40), extending from the second edge (along the length dimension) and leaving a blank strip 112b of unelectroded ceramic along the first edge of the ceramic layer 112. These ceramic layers 112, 114, 116 and 118 are then sintered together to form a unitary multilayer input portion 110 having interdigitated electrodes 111, 113, 115, 117 and 119.

Referring again to FIGS. 11–13: To facilitate the simultaneous application of an input voltage, as well as provide ground connections for the input and output portions 110, 120 and 40, "belt" type electrodes are used both on the input portions 110 and 120 and the insulator layers 50 and 55. As shown in FIGS. 10 and 11, an input ground belt electrode 140 is formed on the first input portion 110 by the outermost electrodes 111 and 119 and side ground electrode 135 printed on the longitudinal side to which electrode 111, 115 and 119 extend. The side ground electrode 135 electrically connects electrodes 111, 115 and 119 to ground. An input electrode 136 printed on the opposite side of the input portion 110 connects interior input electrode 113 and 117 to the input terminal 85. Likewise, a second input ground belt electrode 141 is formed on the second input portion 120 by the outermost electrodes 121 and 129 and side ground electrode 137 printed on the longitudinal side to which electrode 121, 125 and 129 extend. The side ground electrode 137 electrically connects electrodes 121, 125 and 129 to ground. A second input electrode 138 printed on the opposite side of the second input portion 120 connects interior input electrode 123 and 127 to the input terminal 85.

Each insulator layer 50 and 55 also has "belt" type electrodes. More specifically, as shown in FIG. 9, insulator layer 50 has two belt electrodes 131 and 132 bonded or printed on each end. Each insulator belt electrode 131 and 132 comprises a band of conductive material printed along the edge of insulator layer 50 on the inboard face (adjacent the output portion 40 and output electrode 44 or 46, then along one side of the insulator 50, and along the outboard face (adjacent input ground electrode 119). Preferably, the width of each insulator belt electrode 131 and 132 is substantially equal to the width of the adjacent respective output ground electrode 44 and 46, but may be made thinner as long as there is still electrical contact between the input electrode 119, the belt electrodes 131 and 132 and the output ground electrodes 44 and 46. The insulator belt electrodes may also be wider so long as they do not contact the central output electrode band 45a. Preferably, each belt electrode 131 and 132 extends along the edge of the inboard and outboard faces of the insulator layer 50 with a length substantially equal to and coincident with the length of the adjacent input ground electrode 119. Insulator layer 55 also has belt electrodes 133 and 134 constructed in a like manner to place input ground electrode 129 in electrical contact with output ground electrodes 44 and 46.

Thus, input portion 110 has a belt electrode substantially covering the inboard and outboard faces and one side to electrically connect electrodes 119, 115, and 111 to ground. Likewise, input portion 120 has a belt electrode substantially covering the inboard and outboard faces and one side to electrically connect electrodes 129, 125, and 121 to ground. Further more, insulator belt electrodes 131 and 132 connect the output ground electrodes 44 and 46 to the input ground electrodes 119, 115 and 111. Likewise, insulator belt electrodes 133 and 133 connect the output ground electrodes 44 and 46 to the input ground electrodes 129, 125 and 121.

Thus, by the use of belt electrodes 131, 132, 133 and 134 all input and output ground electrodes may be electrically connected to a common ground. This is desirable because it reduces the number of connection points for electrodes, which are historically the point of failure for vibrating devices. The use of the belt electrode for the input portions 110 and 120 also places ground electrodes on the majority of the outboard surfaces of the transformer 3, and thus minimizes the area and associated risks of exposed high voltage electrodes.

Furthermore, because of the design of the belt electrodes, the contact point(s) of the input, output and ground terminals may be made along the center of the transformer 3. Because the transformer 3 is a vibrating device, electrode connections tend to fail if connected to an area subject to vibration. The central axis of the transformer (along output electrode section 45) is a node about which the oscillation of the transformer 3 takes place. Because each electrode is printed to pass across the central axis of vibration of the transformer 3, input, output and ground connections may be made to an area subject to little or no vibration, thus increasing durability and minimizing the risk of failure.

Figure 1:
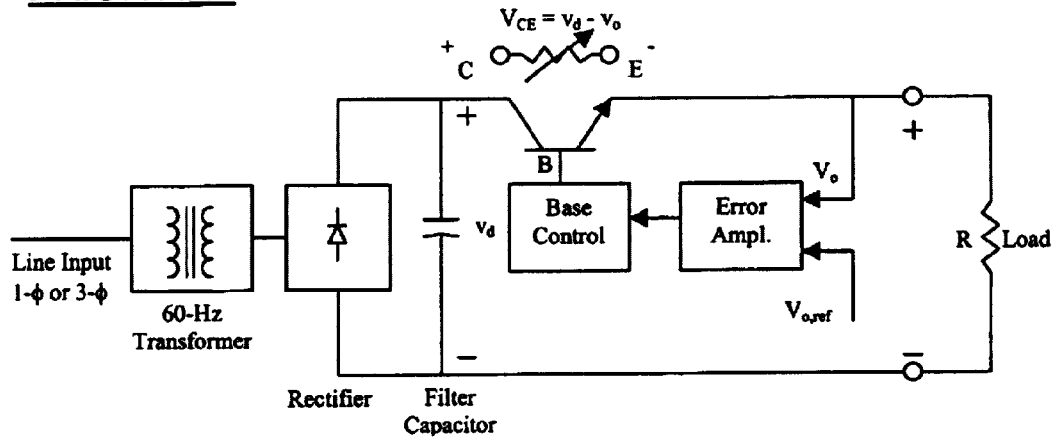
FIG. 1 is schematic of a linear mode DC power supply of the prior art.
Figure 2:
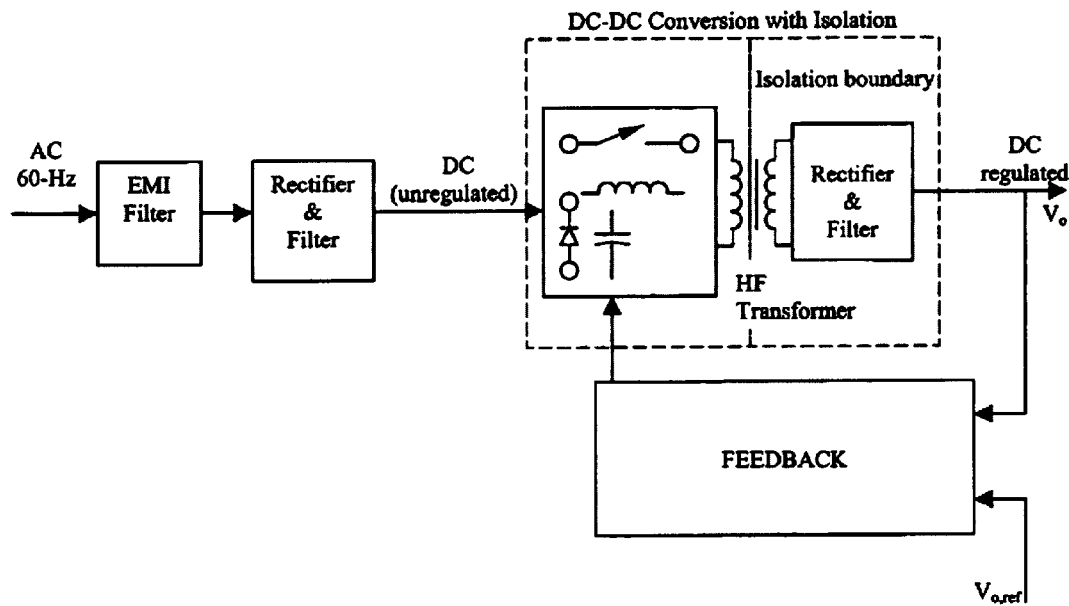
FIG. 2 is schematic of a switch mode DC power supply of the prior art.
Figure 3:
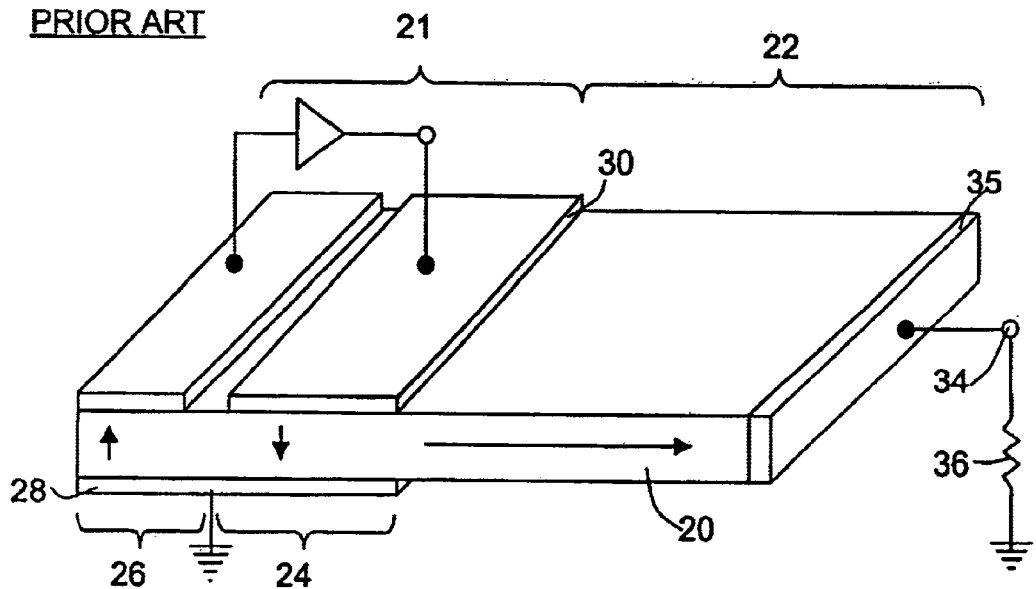
FIG. 3 is a partially schematic perspective view of a typical Rosen type piezoelectric transformer of the prior art.
Figure 4:
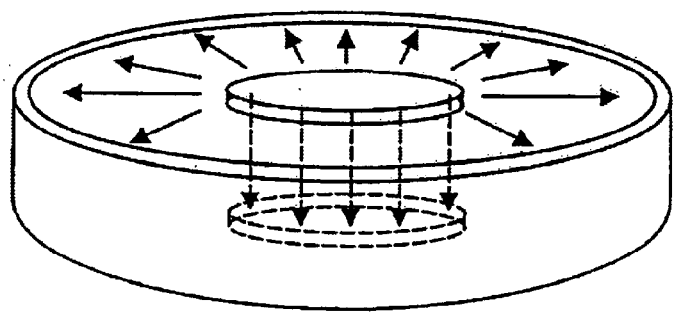
FIG. 4 is a perspective view of another example of a Rosen type piezoelectric transformer of the prior art.
Figure 5:
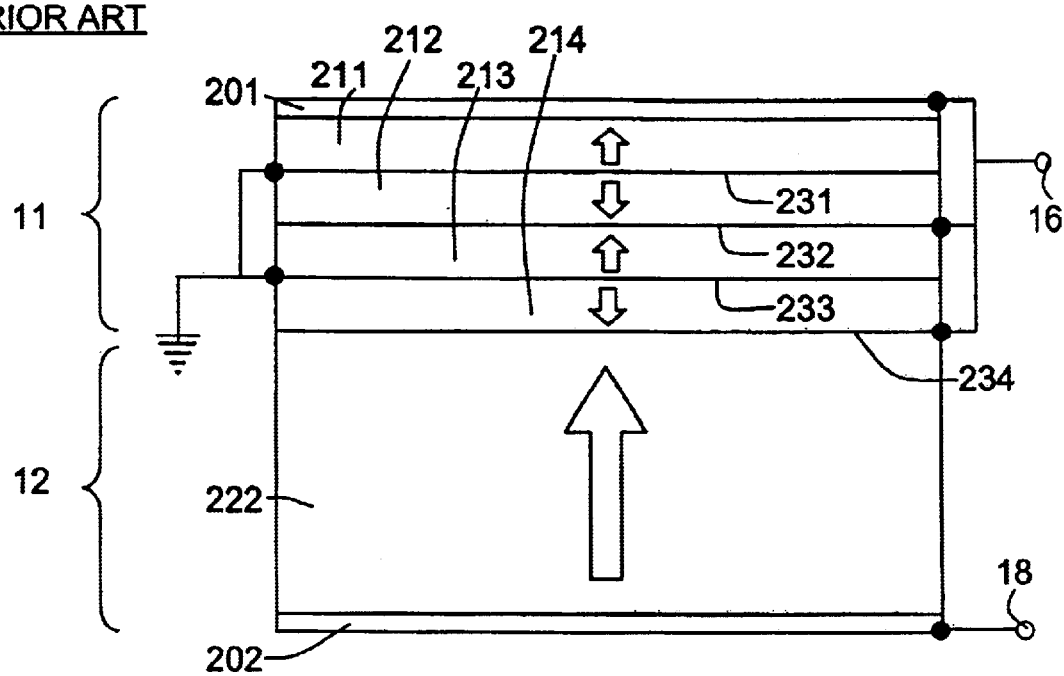
FIG. 5 is a perspective view of a typical multi-layer thickness mode vibration piezoelectric transformer of the prior art.

A double 4-layer-input transformer 3 was constructed as in FIGS. 9–13. The transformer 3 delivered more than twice the power levels of the transformer 2 of FIG. 5 which is limited to less than 5 W. Dimensions of this transformer 3 were 21.25×7.7×4.5 mm3 (V=0.74 cm3), with a total weight of 4.8 gram. Power density of this transformer 3 under 100–200 kohms load was over 13 W/cm3 with efficiency demonstrated over 94% in the final samples. The mass of this transformer 3 is only 0.6 grams more than the transformer 2 of FIG. 5, which is 4.2 grams. This transformer 3 has been made to operate under DC bus levels of 15 to 20V with a step-up ratio on the order of 80 under a load of 200 Kohms. With a 15 vdc input, the output voltage of 1500V under levels of power of 10 W were measured with increase in the temperature lower than 25° C.

Resilient Mounting

Figure 23:
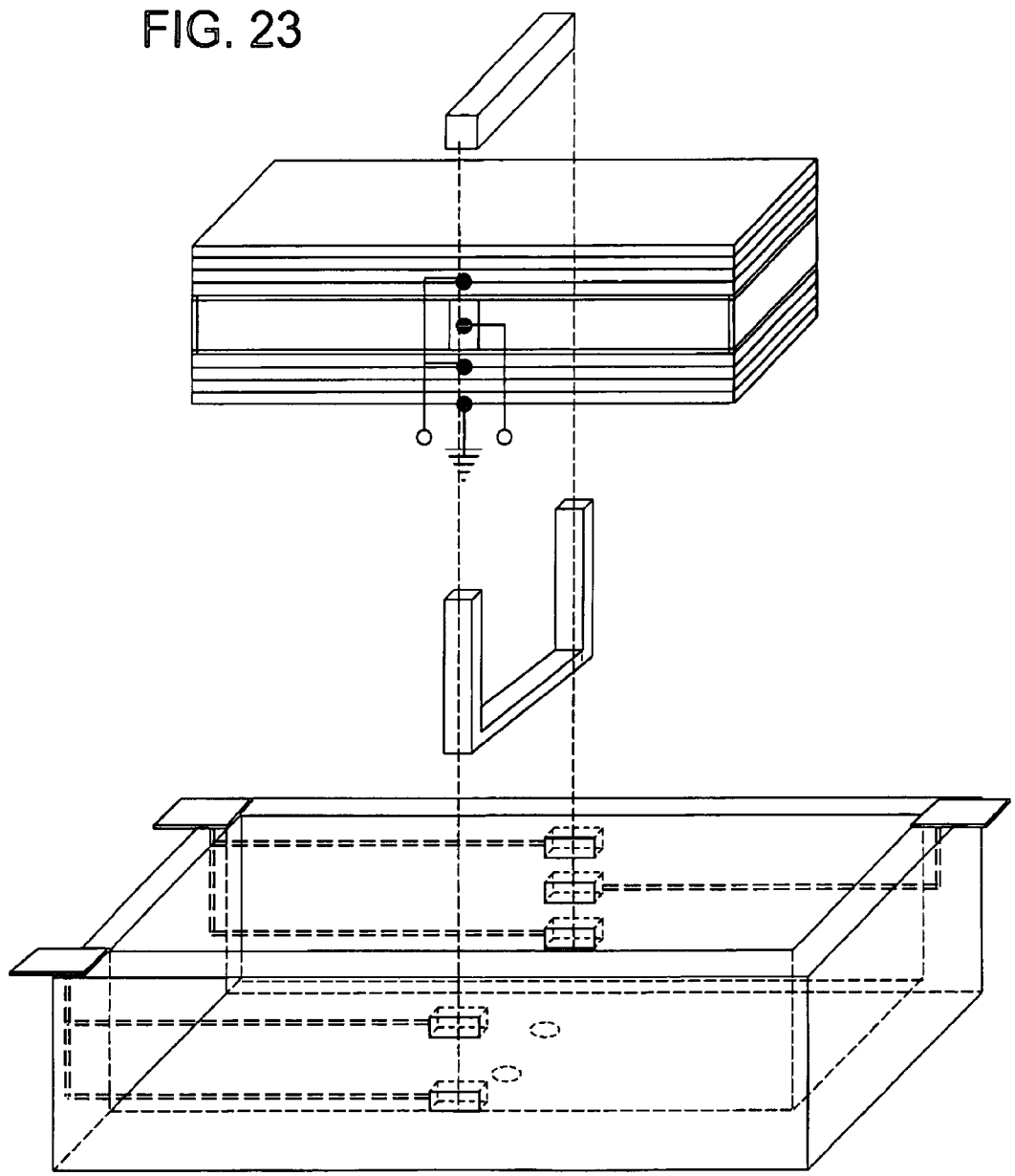
FIG. 23 is a perspective view of the PT of FIG. 9 and a resilient mounting for a printed circuit board.
Figure 24:
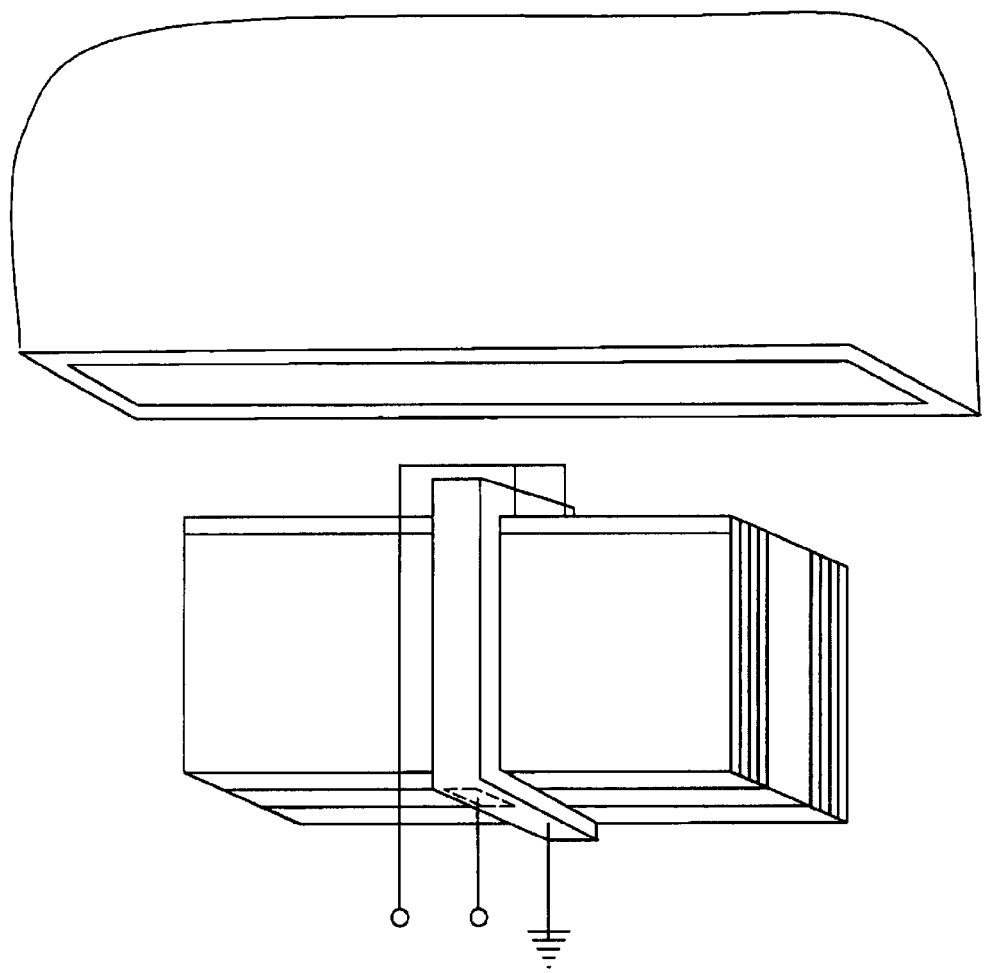
FIG. 24 is a perspective view of the PT of FIG. 9 and another resilient mounting for a printed circuit board.

Referring now to FIGS. 23–24: Due to the mechanical vibration nature of piezoelectric transformers, special attention is paid to the PT's 3 supporting and mounting design. Incorrect mounting would negatively affect the performance. Previously, PT designs connected the wires to the ends which were vibrating surfaces, which became the point of failure for the electrical connections. To avoid this failure, wire lead connections are connected at points along the vibrational node 199 to prevent interfering with the PT's 3 mechanical vibration.

Several solutions have been proposed in the state of the art for fixing piezoelectric transformers. Since it is important for a piezoelectric transformer 3 to have the free vibration of the end faces while mechanical support of the structure is maintained, it is necessary to support the transformer 3 without suppression of the vibration. The best-adopted technique consists of supporting the transformer 3 at positions corresponding to the vibration nodes 199.

Furthermore, in considering the housing design for a PT 3, at least four factors need to be contemplated: (a) operation mode selected, (b) fixation points considered, (c) wire connections, (d) sensitivity to external vibrations, and (e) transmission of mechanical vibration or acoustic vibration to the surrounding parts. Previously PT 3 designs connected the wires to the PT's 3 ends, which were vibrating surfaces.

Referring to FIGS. 23–24: In the preferred embodiment of the invention, the PT 3 is packaged for mounting on a printed circuit board. The package takes the form of an enclosure 200 for the PT 3 that prevents contact between the vibrating surfaces of the PT 3 and the enclosure 200 or any other circuit components, while allowing electrical connections to be made between the PT 3 and other circuit components.

In the package of FIG. 23, the enclosure 200 comprises a box-like container 200 having four side walls 202, 203, 204, 205 and a bottom wall 201. The container 200 has dimensions slightly larger than the PT 3 with respect to the length, width and depth. This allows the PT 3 to be placed in the container 200 while preventing any contact between any of the vibrating surfaces of the PT with the bottom wall 201 or side walls 202, 203, 204, 205 of the container 200.

The bottom wall 201 of the container 200 preferably has one or more projections, and more preferably two projections 211, 212 in the center thereof. These projections 211, 212 are aligned with the central portion 199 of the PT 3, i.e., along a bisector of the PT 3 coincident with the non-vibrating node 199 and central output electrodes 45 of the PT 3.

These projections 211, 212 provide further support to the PT 3 and hold the vibrating surfaces of the PT 3 above the bottom wall 201, thus preventing contact therewith.

The enclosure 200 for the PT 3 also preferably comprises a resilient mounting 240 on one or more faces of the PT 3 at the non-vibrational node 199. The resilient mounting 240 preferably comprises a substance that will securely mount the PT 3 within the enclosure 200, without damping the vibration of the PT 3, but will also prevent transmission of vibrations to the container 200. This substance preferably comprises a silicone adhesive, but may also comprise other flexible, durable, resilient substances. The resilient mounting 240 is preferably a thin strip of material that securely, yet flexibly attaches each the nodal faces 199 of the PT 3 (i.e., two side nodal faces, and the bottom nodal face and/or top nodal face) to the side walls 202, 204 and bottom wall 201 of the container 200. Thus, the PT 3 is fully enclosed within the container 200, while the projections 211, 212 and resilient mounting 240 prevent contact between the bottom wall 201 and vibrating surfaces of the PT 3, the the remainder of the resilient mounting 240 prevents contact between the side walls 202, 203, 204, 205 and vibrating surfaces of the PT 3. The resilient mounting 240 shown in FIGS. 13 and 14 show four strips 241–244 that contact each of the top, bottom, and side nodal faces of the PT 3, but as few as one strip 241 (on the bottom face), or preferably three strips 242–243 (on the bottom and sides faces) may be used.

In order to provide electrical connections between the PT 3 and other circuit components, through holes are provided in walls 202, 204 of the enclosure 200. More specifically, along each side wall 202, 204 adjacent the central node, are one or more holes through which a wire may be run, connecting to the electrodes of the PT 3. The other end of the wire is connected to a terminal, pin or post for connection to one or more circuit components which work in conjunction with the PT. The terminals (pins or posts) may be fixed or connected anywhere on the enclosure 200, but most preferably along the edges of the walls 201—201 of the enclosure 200, for simple connection of the posts to circuit components.

Any particular through hole may be used to connect a wire from one or more terminals to a ground electrode. For example, a single though hole may be used to connect one or more wires to all grounds (input and output) to serve as a common ground. Alternately, two through holes are used to connect the input grounds separately from the output ground(s), i.e., one terminal may be connected with a wire running in one through hole to all input grounds, and another terminal may be connected with a wire running a second through hole to all output grounds of the PT 3.

Similarly, a single through hole may be used to connect one or more wires to all input electrodes to serve as a input terminal. Alternately, two through holes may be used to connect the input voltages to the input portions separately from the each other, i.e., one terminal may be connected with a wire running in one through hole to the input electrodes of one input portion, and another terminal may be connected with a wire running a second through hole to the input electrodes of the second input portion of the PT 3. Likewise, a single through hole may be used to connect one or more wires to all output electrodes to serve as a output terminal of the PT 3.

The resilient mounting 240 may also have through holes therein to accommodate passage of wires from the input, output and ground electrodes on the nodal faces 199 of the PT, through the resilient mounting 240. The wires may pass through the resilient mounting directly to the printed circuit board. Alternately, the wires may continue through the through holes of the enclosure 200 and to the posts, which may then be connected to the circuit board.

While the above description contains many specificities, these should not be construed as limitations on the scope of the invention, but rather as exemplification of preferred embodiments thereof. Many other variations are possible, for example:

While in the preferred embodiment of the invention the ceramic layers are preferably constructed of a PZT ceramic material, other electroactive materials may be used in its place;

The ceramic layers can be piezoelectric, ferroelectric or other electroactive elements;

The input portion may comprise as few as one ceramic layer or may be of a multi-layer construction;

The shape of the PT need not be rectangular bar-shaped, and many other shapes or configurations are possible;

The direction of polarization of the input layers can vary and need not be toward the central electrode, but may be away from the central electrode or combinations thereof;

The direction of polarization of the output layer need not be toward the central electrode, but may be away the central electrode;

The central electrode of the output layer need not be the high voltage electrode—the outer electrodes may carry the high voltage and the central electrode may be ground referenced;

The insulating layer need not be constructed of alumina, but may be constructed of other insulating materials.

The insulating layer need not extend to the edges or past the edges, but may simply be large enough to isolate the high voltage electrode from the input or ground electrodes.

Accordingly, the scope of the invention should be determined not by the embodiment illustrated, but by the appended claims and their legal equivalents.

I claim:

1. A modular power supply, comprising:

a DC voltage source;

a plurality of driver circuits for applying a DC voltage to a plurality of transformer,
    each of said driver circuits having an electrical input connected to said DC voltage source;

a plurality of laminated piezoelectric transformers, each of said piezoelectric transformers, comprising;

a first input portion comprising a first electroactive layer having first and second opposing electroded major faces and first and second opposing minor faces and polarized such that upon application of voltage across said first and second opposing electroded major faces, said first electroactive layer deforms in a longitudinal direction parallel to said first and second opposing electroded major faces and perpendicular to said first and second opposing minor faces;

a second input portion comprising a second electroactive layer having first and second opposing electroded major faces and first and second opposing minor faces and polarized such that upon application of voltage across said first and second opposing electroded major faces, said second electroactive layer deforms in a longitudinal direction parallel to said first and second opposing electroded major faces and perpendicular to said first and second opposing minor faces;

an output electroactive layer having first and second opposing major faces, first and second opposing electroded minor faces, third and fourth opposing minor faces;
    said output electroactive layer having a central output electrode portion between said first and second opposing electroded minor faces;
    said output electroactive layer having a first output portion between said central output electrode portion and said first electroded minor face, said first output portion being polarized in a direction normal to said first electroded minor face;
    said output electroactive layer having a second output portion between said central output electrode portion and said second electroded minor face, said second output portion being polarized in a direction normal to said second electroded minor face;

a first dielectric layer having first and second opposing major faces;
    said first major face of said first dielectric layer being bonded to said first electroded major face of said first input electroactive layer;

said second major face of said first dielectric layer being bonded to said first major face of said output electroactive layer;

a second dielectric layer having first and second opposing major faces;

said first major face of said second dielectric layer being bonded to said first electroded major face of said second input electroactive layer;

said second major face of said dielectric layer being bonded to said second major face of said output electroactive layer;

wherein upon application of a voltage across said first and second electroded major faces of said first input electroactive layer, said first input portion deforms in said longitudinal direction;

and wherein upon application of a voltage across said first and second electroded major faces of said second input electroactive layer, said second input portion deforms in said longitudinal direction;

and wherein upon said longitudinal deformation of said first and second input portions, said first and second bonded dielectric layers and said output electroactive layer mechanically strain in said longitudinal direction;

and wherein said mechanical strain of said output electroactive layer in said longitudinal direction piezoelectrically generates a first output voltage between said first electroded minor face and said central output electrode portion and a second output voltage between said second electroded minor face and said central output electrode portion;

and wherein an output of each of said driver circuits is electrically connected to a transformer input terminal of each of said piezoelectric transformers; and a plurality of rectifiers, each of said rectifiers having a first and second rectifier input terminals and first and second output terminals;

each of said rectifiers having said first rectifier input terminal being connected to said first and second opposing electroded minor faces of said output portion of one of said plurality of piezoelectric transformers;

each of said rectifiers having said second rectifier input terminal being connected to said central electrode of said output portion of one of said plurality of piezoelectric transformers.

* * * * *